(12) United States Patent
Hayashi

(10) Patent No.: US 8,425,983 B2
(45) Date of Patent: Apr. 23, 2013

(54) METHOD FOR PRODUCING LITHOGRAPHIC PRINTING PLATE AND PRODUCTION APPARATUS THEREFOR

(75) Inventor: Kenji Hayashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 180 days.

(21) Appl. No.: 13/038,850

(22) Filed: Mar. 2, 2011

(65) Prior Publication Data

US 2011/0217458 A1 Sep. 8, 2011

(30) Foreign Application Priority Data

Mar. 3, 2010 (JP) ................................. 2010-046894

(51) Int. Cl.
*B05D 3/02* (2006.01)

(52) U.S. Cl.
USPC ....................................................... 427/374.1

(58) Field of Classification Search ................. 427/374.1
See application file for complete search history.

(56) References Cited

U.S. PATENT DOCUMENTS

| | | | |
|---|---|---|---|
| 5,711,086 A | 1/1998 | Stubbing | |
| 6,497,926 B1 | 12/2002 | Yokota et al. | |
| 7,862,861 B2 | 1/2011 | Kito | |
| 2009/0087778 A1 | 4/2009 | Hayashi | |

FOREIGN PATENT DOCUMENTS

| | | | |
|---|---|---|---|
| JP | 61149962 A | * | 7/1986 |
| JP | 9-502252 A | | 3/1997 |
| JP | 2000-158814 A | | 6/2000 |
| JP | 2000-516334 A | | 12/2000 |
| JP | 2001-18526 A | | 1/2001 |
| JP | 2001-133929 A | | 5/2001 |
| JP | 2002-333275 A | | 11/2002 |
| JP | 2002-367950 A | | 12/2002 |
| JP | 2005-334705 A | | 12/2005 |
| JP | 2009-86343 A | | 4/2009 |
| WO | WO 98/06889 A3 | | 2/1998 |

* cited by examiner

*Primary Examiner* — Nathan Empie
(74) *Attorney, Agent, or Firm* — Birch, Stewart, Kolasch & Birch, LLP.

(57) ABSTRACT

An apparatus for producing a printing plate by applying a first coating liquid onto a belt-like support, and drying the first coating liquid to form an image recording layer; and applying a second coating liquid for an overcoat layer onto the image recording layer, and drying the second coating liquid, comprises: a coating liquid cooling device that cools the second coating liquid so that a temperature T1 of the second coating liquid may fall within a predetermined range; a support cooling device that cools the belt-like support so that the temperature of the second coating liquid may fall within the predetermined range; and an initial drying device that initially dries the overcoat layer by air having a low temperature and a dew point of not more than 5° C. parallel to a surface of the overcoat layer at an air velocity of 8 to 15 m/sec.

7 Claims, 5 Drawing Sheets

FIG. 5

| | CONDITION FOR COOLING SUPPORT | TEMPERATURE CONDITION | INITIAL DRYING CONDITIONS OF OVERCOAT LAYER | | | | | EVALUATION RESULT | | | |
|---|---|---|---|---|---|---|---|---|---|---|---|
| | SURFACE TEMPERATURE AFTER COOLING | TEMPERATURE CONDITION OF OVERCOAT COATING LIQUID | TEMPERATURE | AIR VELOCITY | DEW POINT | TIME | MOISTURE CONTENT | SURFACE STATE | MIXED CONTENT OF OVERCOAT LAYER | ON-PRESS DEVELOPING PROPERTIES | PRINT DURABILITY |
| | °C | °C | °C | m/s | °C | Sec | % | SENSE | (%) | (SHEETS) | (10,000 SHEETS) |
| EXAMPLE 1 | 10 | 10 | 10 | 8 | 5 | 5 | 30 | A | 35 | 35 | 4.2 |
| EXAMPLE 2 | 10 | 10 | 10 | 10 | 5 | 5 | 25 | A | 29 | 25 | 4.3 |
| EXAMPLE 3 | 10 | 10 | 10 | 15 | 5 | 5 | 20 | A | 21 | 20 | 4.5 |
| EXAMPLE 4 | 10 | 10 | 25 | 8 | 5 | 5 | 25 | A | 31 | 25 | 4.2 |
| EXAMPLE 5 | 10 | 10 | 40 | 8 | 5 | 5 | 15 | A | 45 | 49 | 4.0 |
| EXAMPLE 6 | 15 | 10 | 10 | 8 | 5 | 5 | 25 | A | 35 | 27 | 4.3 |
| EXAMPLE 7 | 20 | 10 | 10 | 8 | 5 | 5 | 20 | A | 35 | 30 | 4.1 |
| EXAMPLE 8 | 10 | 10 | 10 | 8 | 3 | 5 | 25 | A | 30 | 32 | 4.2 |
| EXAMPLE 9 | 10 | 15 | 10 | 8 | 5 | 5 | 30 | A | 45 | 48 | 4.2 |
| EXAMPLE 10 | 10 | 20 | 10 | 8 | 5 | 5 | 30 | A | 45 | 47 | 4.2 |
| COMPARATIVE EXAMPLE 1 | 5 | 10 | 10 | 8 | 5 | 5 | 50 | A | 54 | 55 | 4.0 |
| COMPARATIVE EXAMPLE 2 | 25 | 10 | 10 | 8 | 5 | 5 | 20 | A | 50 | 50 | 4.3 |
| COMPARATIVE EXAMPLE 3 | 40 | 10 | 10 | 8 | 5 | 5 | 15 | A | 50 | 73 | 4.2 |
| COMPARATIVE EXAMPLE 4 | 10 | 10 | 5 | 8 | 5 | 5 | 80 | NOT DRIED | 63 | 100 | 3.7 |
| COMPARATIVE EXAMPLE 5 | 10 | 10 | 50 | 8 | 5 | 5 | 10 | A | 60 | 61 | 3.5 |
| COMPARATIVE EXAMPLE 6 | 10 | 10 | 10 | 5 | 5 | 5 | 40 | A | 53 | 50 | 3.9 |
| COMPARATIVE EXAMPLE 7 | 10 | 10 | 10 | 18 | 5 | 5 | 15 | A | 21 | 20 | 4.4 |
| COMPARATIVE EXAMPLE 8 | 10 | 10 | 10 | 8 | 10 | 5 | 80 | NOT DRIED | 65 | 100 | 3.3 |
| COMPARATIVE EXAMPLE 9 | 10 | 5 | 10 | 8 | 5 | 5 | 45 | F | 50 | 51 | 4.1 |
| COMPARATIVE EXAMPLE 10 | 10 | 25 | 10 | 8 | 5 | 5 | 20 | A | 49 | 51 | 4.3 |

US 8,425,983 B2

METHOD FOR PRODUCING LITHOGRAPHIC PRINTING PLATE AND PRODUCTION APPARATUS THEREFOR

BACKGROUND OF THE INVENTION

1. Field of the Invention

The presently disclosed subject matter relates to a method for producing a lithographic printing plate of a negative type including a polymerizable compound in which an image can be recorded by a laser, and a production apparatus therefor, and particularly relates to a method for producing a lithographic printing plate of a negative type including a polymerizable compound in which after an image is exposed, the image can be developed by an ink and/or dampening water on a printer, and a production apparatus therefor.

2. Description of the Related Art

A lithographic printing plate generally includes a lipophilic image area that receives an ink in a printing process and a hydrophilic non-image area that receives dampening water. Lithography is a method by using the property of water and an oily ink repelling each other. Of the lithographic printing plate, the lipophilic image area and the hydrophilic non-image area respectively work as an ink receiving portion and a dampening water receiving portion (non-ink receiving portion) so that differences in adhesiveness of the ink is produced on the surface of the lithographic printing plate, and the ink is applied only onto the image area. Then, printing is performed by transferring the ink onto a printing medium such as paper.

In order to produce this lithographic printing plate, conventionally, the lithographic printing plate has been obtained as follows: using a lithographic printing plate (PS (Pre-Sensitized) plate) formed by providing an lipophilic photosensitive resin layer (image recording layer) on a hydrophilic support, the PS plate is exposed through a mask such as a lith film, and then, a development treatment by an alkaline developing agent or the like is performed so that the image recording layer corresponding to the image area is left while an unnecessary image recording layer corresponding to the non-image area is dissolved and removed.

Owing to recent advancement in this field, the lithographic printing plate is obtained by a CTP (computer to plate) technique at present. Namely, the lithographic printing plate is obtained by scanning and exposing the lithographic printing plate directly with a laser or laser diode, not through the lith film, and developing the lithographic printing plate. Particularly, lithographic printing plates including a photopolymerizable image recording layer in which a polymerizable compound is polymerized and crosslinked are known. These lithographic printing plates usually have an overcoat layer on the image recording layer in order to block oxygen that inhibits polymerization.

In such a lithographic printing plate having the overcoat layer laminated on the image recording layer, the image recording layer and the overcoat layer are mixed at a stage where the overcoat layer is applied onto the image recording layer and dried, and a component to be contained in the image recording layer moves to the overcoat layer. For this reason, function that the image recording layer should originally have is impaired, causing reduction in both developing properties and print durability. Ink absorbency and print durability are also reduced because the component to be contained in the overcoat layer moves to the image recording layer.

As a method for suppressing the mixing mentioned above, the reduction of the time taken for the overcoat layer to be dried has been performed by reducing an amount of a coating liquid, reinforcing a drying condition, and the like. However, there are restrictions on coating suitability in production, and a sufficient effect has not been obtained.

Problems of the above method for reinforcing drying are that a whole film is densified and that a thermal reaction in an object to be dried is caused over the whole inside of the film.

As mentioned above, a method for efficiently drying and removing a residual solvent in the object to be dried without reducing performance of the object to be dried, and further accelerating densification of the surface and preventing mixing between the respective layers has been strongly desired.

As a drying technique, a method using drying hot air is usually used. On the other hand, various drying methods using hot air containing a solvent vapor are also proposed.

For example, Japanese National Publication of International Patent Application No. 1997-502252 proposes an apparatus that uses a superheated water vapor to continuously dry an object to be dried that contains moisture. Japanese Patent Laid-Open No. 2002-333275 proposes an apparatus that uses a superheated water vapor to perform a drying processing on food products.

Japanese National Publication of International Patent Application No. 2000-516334 and Japanese Patent Laid-Open No. 2002-367950 also propose a vapor dryer for removing waterdrops and other contaminants from a device part with sufficient accuracy by using an inflammable solvent vapor such as isopropyl alcohol or an equivalent solvent having a low ignition point.

Japanese Patent Laid-Open No. 2000-158814 describes a method proposed by Vrentas et al. according to a theoretical analysis as a method for removing a residual solvent of a coating film [J. Appl. Polym. Sci, 30, 4499 (1985)]. As a factor that causes difficulties in removing a solvent having a high boiling point and the like that remain in a polymer resin, Vrentas et al. mention that the diffusion coefficient of the solvent in the polymer resin is drastically reduced as the amount of the solvent that remains in the polymer resin is decreased, and that the diffusion coefficient of the solvent in the polymer resin is smaller as the size (mol molecular volume) of the molecule in the solvent itself is larger.

Namely, Vrentas et al. propose that in the polymer resin film in which a slight amount of the solvent having a high boiling point remains, 1) the polymer resin film is exposed to a vapor of a solvent whose mol molecular volume is smaller than that of the solvent having a high boiling point, and heated; and 2) the polymer resin film is removed from the second solvent vapor atmosphere and heated.

Further, Japanese Patent Laid-Open No. 2009-86343 describes drying a photopolymer type photosensitive lithographic printing plate having an overcoat layer (overcoat layer or oxygen permeability adjusting layer) applied on a top layer of the plate by supplying a superheated vapor after the plate is dried in a overcoat layer drying zone, drying the overcoat layer while giving moisture to the overcoat layer, and then controlling the moisture content of the film at cooling and humidity control steps.

SUMMARY OF THE INVENTION

A drawback of the conventional hot air drying is that the image recording layer and the overcoat layer are mixed at the stage where the overcoat layer is applied onto the image recording layer and dried. For example, in the case where the overcoat layer contains polyvinyl alcohol, when the solvent in the image recording layer is dried by the conventional drying technique (at a temperature of not less than 100° C., with heated air having a dew point of 5 to 20° C.), the hydrophilic polyvinyl alcohol is mixed in the image recording layer. For this reason, curing of the image recording layer by exposure becomes insufficient, causing reduction in print durability, or the like. Also, in the case where mica is contained in the overcoat layer, the mica mixed in the image recording layer causes reduction in ink absorbency. Namely, although mixing can be suppressed by sufficiently performing hot air drying on the image recording layer, the state of the image recording layer changes, leading to production of poor quality, which is another drawback.

The presently disclosed subject matter was made in consideration of such circumstances. An object of the presently disclosed subject matter is to make it possible to apply and drying an overcoat layer in a manner that an image recording layer and the overcoat layer are hardly mixed, and thus to provide a method for producing a lithographic printing plate in which developing properties and print durability can be improved.

In order to achieve the object, a method for producing a lithographic printing plate according to a first aspect of the presently disclosed subject matter is a method for producing a lithographic printing plate comprising: applying a first coating liquid having a composition comprising at least a sensitizing dye, a radical polymerization initiator, and a radical polymerizable compound onto a belt-like support continuously conveyed, and drying the applied first coating liquid to form an image recording layer; cooling a second coating liquid for an overcoat layer in a manner that a temperature T1 of the coating liquid for an overcoat layer falls within a temperature range of $T_L+10°$ C.$\leq$T1$\leq$$T_L+20°$ C., wherein $T_L$ is defined as a temperature of a component having a lowest melting point or glass transition temperature among composition components that form the first coating liquid for the image recording layer; applying the second coating liquid for the overcoat layer onto the image recording layer; cooling the belt-like support after forming the image recording layer and before applying the overcoat layer in a manner that a temperature T2 of the belt-like support having the image recording layer formed thereon falls within the temperature range of the second coating liquid for the overcoat layer; initially drying the overcoat layer by blowing cold air parallel to a surface of the overcoat layer at an air velocity of 8 to 15 m/sec after applying the overcoat layer and before drying the overcoat layer, the cold air having a low temperature of not less than a lower limit in a temperature range of the cooled belt-like support and not more than the lower limit+30° C. and having a dew point of not more than 5° C.; and drying the overcoat layer after the initial drying.

According to the production method of the presently disclosed subject matter, the temperature T1 of the second coating liquid for an overcoat layer applied onto the image recording layer is set so as to fall within $T_L+10°$ C.$\leq$T1$\leq$$T_L+20°$ C. wherein $T_L$ is defined as a temperature of a component having the lowest melting point or glass transition temperature in the composition components that form the first coating liquid for an image recording layer. Namely, of the composition components in the image recording layer, the melting point or glass transition temperature of a component most easily diffused and mixed in the overcoat layer is set so as to be approximately equal to the temperature of the second coating liquid for an overcoat layer. Thereby, diffusive mixing between the overcoat layer and the image recording layer when the overcoat layer is applied onto the image recording layer can be effectively suppressed. In the case where the lowest melting point or glass transition temperature of the composition component is lower than 0° C., $T_L$ is 0° C.

Further, instead of applying the overcoat layer immediately after drying the image recording layer, the temperature of the belt-like support warmed by drying the image recording layer is cooled so that the support may have a temperature T2 identical to a temperature in the above-mentioned temperature range of the second coating liquid for an overcoat layer. In this case, the thickness of the belt-like support is significantly larger than the coating thickness of the image recording layer, and the belt-like support and the image recording layer have a different heat capacity. For this reason, by cooling the belt-like support, the image recording layer is also cooled to approximately the same temperature as that of the belt-like support. Thereby, when the overcoat layer is applied onto the image recording layer, diffusive mixing between the two layers can be suppressed much more effectively.

Further, initial drying is performed by the cold air having a low temperature and a low dew point unlike the conventional drying method in which drying at a high temperature is performed (for example, at a temperature of not less than 100° C., with heated air having a dew point of 5 to 20° C.) immediately after applying the overcoat layer. Accordingly, diffusive mixing between the overcoat layer and the image recording layer during drying the overcoat layer can be suppressed still more effectively. In drying by the cold air, in the case where the drying rate is low and the drying time is long, there is a concern that the diffusive mixing between the overcoat layer and the image recording layer gradually progress in spite of drying at a low temperature. However, in the presently disclosed subject matter, the diffusive mixing between the overcoat layer and the image recording layer can be further suppressed by increasing the air velocity of the cold air in the range of 8 to 15 m/sec to increase the drying rate and reduce the initial drying time. In addition, in the initial drying, because the cold air is blown parallel to the surface of the overcoat layer, no drying unevenness is produced even at a high speed like the air velocity of 8 to 15 m/sec.

As mentioned above, the overcoat is applied and dried in a manner that the image recording layer and the overcoat layer may hardly be mixed. Accordingly, developing properties and print durability can be improved.

In the method for production according to the presently disclosed subject matter, at the initial drying step, the overcoat layer is preferably dried until the overcoat layer reaches a set-to-touch state.

Here, the set-to-touch state of the overcoat layer means the state where the overcoat layer does not adhere to a finger when the surface of the overcoat layer is touched with the finger. The viscosity of the overcoat layer at this time is approximately $10^8$ to $10^{10}$ poises.

Once the overcoat layer is dried to the set-to-touch state, neither of the diffusive mixing between the overcoat layer and the image recording layer occurs any more even if the overcoat layer is dried at a high temperature on the conventional drying condition.

In the method for production according to the presently disclosed subject matter, the image recording layer is preferably an image recording layer on which an image can be formed by supplying a printing ink and/or dampening water on a printer after exposure to remove an unexposed portion. This is because the presently disclosed subject matter is particularly effective in preventing the composition component of the image recording layer and the composition component of the overcoat layer for on-press development from being mixed.

In the method for production according to the presently disclosed subject matter, the overcoat layer preferably contains a water soluble polymer. Examples of the water soluble polymer for the overcoat layer include polyvinyl alcohol.

In the presently disclosed subject matter, the overcoat layer preferably contains a lamellar compound. Examples of the lamellar compound include mica.

This is because ink absorbency is reduced when the lamellar compound for the overcoat layer is mixed in the image recording layer.

In order to achieve the object, a production apparatus for a lithographic printing plate, comprising: a coating and drying device for an image recording layer that applies a first coating liquid having a composition comprising at least a sensitizing dye, a radical polymerization initiator, and a radical polymerizable compound onto a belt-like support continuously conveyed, and that dries the applied first coating liquid to form an image recording layer; a coating liquid cooling device that cools a second coating liquid for an overcoat layer in a manner that a temperature T1 of the coating liquid for an overcoat layer falls within a temperature range of $T_L+10°$ C.$\leq T1 \leq T_L+20°$ C., wherein $T_L$ is defined as a temperature of a component having a lowest melting point or glass transition temperature among composition components that form the first coating liquid for an image recording layer; a support cooling device that cools the belt-like support after forming the image recording layer and before applying the overcoat layer in a manner that a temperature T2 of the belt-like support having the image recording layer formed thereon falls within the temperature range of the second coating liquid for a overcoat layer; a coating device for the overcoat layer that applies the second coating liquid for the overcoat layer onto the image recording layer; an initial drying device that initially dries the overcoat layer by blowing cold air parallel to a surface of the overcoat layer at an air velocity of 8 to 15 m/sec after applying the overcoat layer and before drying the overcoat layer, the cold air having a low temperature of not less than a lower limit in the temperature range of the cooled belt-like support and not more than the lower limit+30° C. and having a dew point of not more than 5° C.; and a drying device that dries the overcoat layer after the initial drying.

This aspect of the presently disclosed subject matter configures the method according to the first aspect of the presently disclosed subject matter as an apparatus invention.

In the method for producing a lithographic printing plate and the production apparatus therefor according to the presently disclosed subject matter, an overcoat layer can be applied and dried in a manner that the image recording layer and the overcoat layer may hardly be mixed. Therefore, developing properties and print durability of the lithographic printing plate can be improved. Accordingly, particularly, it is possible to improve on-press developing properties of the lithographic printing plate in which the image recording layer of the unexposed portion can be removed on the printer by an ink and/or dampening water.

BRIEF DESCRIPTION OF THE DRAWINGS

FIG. 5 is a table showing Examples and Comparative Examples.

DETAILED DESCRIPTION OF THE PREFERRED EMBODIMENTS

Hereinafter, preferable embodiments of a method for producing a lithographic printing plate and a production apparatus therefor according to the presently disclosed subject matter will be described in detail with reference to the accompanying drawings.

Figure 1:
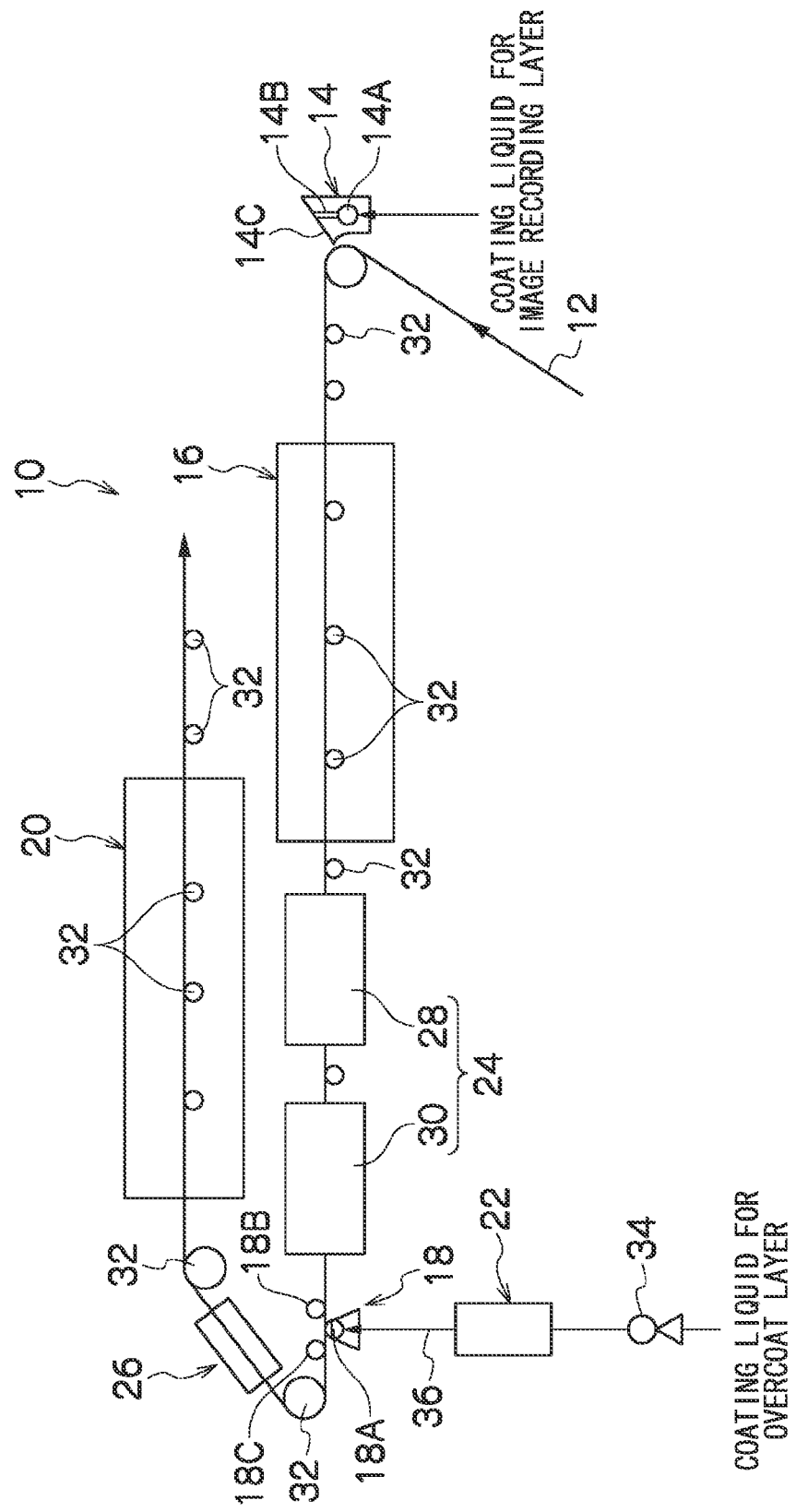
FIG. 1 is a schematic view showing an example of an entire configuration of a production apparatus for a lithographic printing plate precursor according to the presently disclosed subject matter.

FIG. 1 is a schematic view illustrating an entire configuration of a production apparatus 10 for a lithographic printing plate according to an embodiment of the invention.

As shown in FIG. 1, the production apparatus 10 for a lithographic printing plate has a conventional configuration including a coater 14 for an image recording layer that applies a coating liquid for an image recording layer onto a belt-like support 12 (for example, aluminum plate), a dryer 16 for an image recording layer that dries an image recording layer, a coater 18 for an overcoat layer that applies a coating liquid for an overcoat layer onto the image recording layer, and a dryer 20 for an overcoat layer that dries an overcoat layer. In addition to these, the production apparatus 10 includes a coating liquid cooling device 22 that cools the coating liquid for an overcoat layer, a support cooling device 24 that cools the belt-like support 12 to which the overcoat layer is applied, and an initial drying device 26 that initially dries the overcoat layer.

First, by the coater 14 for an image recording layer, the coating liquid for an image recording layer is applied onto the belt-like support 12 subjected to surface roughening process and having an undercoat layer applied thereto.

The coating liquid for an image recording layer in the presently disclosed subject matter is composed of a composition containing at least a sensitizing dye, a radical polymerization initiator, and a radical polymerizable compound. Namely, each component that composes the composition for the image recording layer is dispersed or dissolved in a known solvent to prepare the coating liquid. This coating liquid is applied onto the belt-like support 12 continuously conveyed. As the coater 14 for an image recording layer, known coaters such as a bar coater, an extrusion coater, and slide bead coaters (shown in FIG. 1) can be used. In a slide bead coater shown in FIG. 1, the coating liquid supplied to a pocket 14A of the coater main body flows through a slit 14B, and is discharged to a sliding surface 14C. The coating liquid flows through the sliding surface 14C, and is applied from a tip end of the sliding face onto the belt-like support 12 through a bead (coating liquid reservoir).

Next, the image recording layer is dried by the dryer 16 for an image recording layer in the belt-like support 12 to which the image recording layer is applied. In the presently disclosed subject matter, the image recording layer is desirably dried to the drying point thereof. Here, the drying point is a point of time when the coating liquid reaches dryness in which surface gloss of the object to be dried to which the coating liquid is applied is no longer changed. Specifically, the drying point is a critical point at which a drying period at a constant rate shifts to a drying period at a decreasing rate, and is a point of time at which the amount of solid content reaches the range of approximately 70 to 90% by mass. In the image recording layer dried to the drying point, stickiness remains to some extent in a warmed state immediately after drying. In this case, by sufficiently drying the image recording layer, mixing between the overcoat layer and the image recording layer can be suppressed in subsequent application of the overcoat layer. However, as mentioned above, excessive drying to the point of not less than the drying point changes the state of the image recording layer, causing poor quality.

Various kinds of drying methods such as a hot air method by spraying hot air onto the image recording layer, a heater heating method using a heater such as an infrared ray heater, and a heating roller method by contacting a heating roller with the belt-like support can be used for the dryer 16 for an image recording layer. Particularly, the hot air method is preferable. In the case of the hot air method, drying is preferably performed by heated air having a temperature of not less than 100° C. and a dew point of 5 to 20° C., for example.

Next, in the belt-like support 12 on which the image recording layer is formed, the temperature of the belt-like support 12 increased by drying heat of the dryer 16 for an image recording layer is cooled by the support cooling device 24. In this case, the number of the cooling device may be one. Considering the purpose and cooling efficiency, the cooling device is preferably formed of two sets of first and second cooling devices 28 and 30. The first cooling device 28 cools the belt-like support 12 rapidly until the temperature of the belt-like support 12 reaches approximately 30 to 40° C. in order to prevent transfer onto conveying rolls 32, 32 . . . due to stickiness of the image recording layer, and distortion and scratches of the belt-like support 12.

The second cooling device 30 also cools the belt-like support 12 so that the temperature of the belt-like support 12 having the image recording layer formed thereon may fall within the same range of the temperature as that of the temperature of the coating liquid for an overcoat layer described later, in order to prevent mixing of the image recording layer with the overcoat layer. Here, first, the coating liquid for an overcoat layer will be described first in order to easily understand the cooling temperature of the belt-like support 12.

As shown in FIG. 1, by a pump 34, the coating liquid for an overcoat layer is flowed through a feeding pipe 36, and is supplied to the coater 18 for an overcoat layer. In addition, the coating liquid for an overcoat layer is cooled by the coating liquid cooling device 22 provided in the course of the feeding pipe 36 so that the following conditions may be satisfied. Namely, the temperature T1 of the coating liquid at the time of applying the overcoat layer falls within $T_L+10°$ C.$\leqq T1 \leqq T_L+20°$ C. wherein $T_L$ is defined as a temperature of a component having the lowest melting point or glass transition temperature among the composition components that compose the coating liquid for an image recording layer. In the case where the lowest melting point or glass transition temperature of the composition component is lower than 0° C., $T_L$ is 0° C. The coating liquid cannot be applied when the temperature of the coating liquid at the time of applying the overcoat layer is not more than 0° C.

The coating liquid cooling device 22 is not limited in particular as long as the coating liquid for an overcoat layer can be cooled on the above conditions.

As mentioned above, before the cooled overcoat layer is applied onto the image recording layer, the belt-like support 12 is cooled by the second cooling device 30 so that the temperature of the belt-like support 12 may fall within the same range of the temperature as that of the cooling temperature of the coating liquid for an overcoat layer. Namely, the second cooling device 30 cools the belt-like support 12 so that a temperature T2 of the belt-like support 12 may fall within $T_L+10°$ C.$\leqq T2 \leqq T_L+20°$ C. wherein $T_L$ is defined as a temperature of a component having the lowest melting point or glass transition temperature of the composition components that compose the coating liquid for an image recording layer. In this case, the thickness of the belt-like support 12 is significantly larger than the coating thickness of the image recording layer, and the belt-like support 12 and the image recording layer have a different heat capacity. For this reason, by cooling the belt-like support 12, the image recording layer is also cooled to approximately the same temperature as that of the belt-like support 12. The first and second cooling devices 28 and 30 may be those of a type that sprays cold air onto the belt-like support 12 and/or the image recording layer, those of a type that contacts a cooling roller with the belt-like support 12, or those of other type. In short, the first and second cooling devices 28 and 30 may be those that can efficiently cool the belt-like support 12.

Then, the overcoat layer is applied by the coater 18 for an overcoat layer onto the image recording layer on the belt-like support 12 thus cooled. As the coater 18 for an overcoat layer, known coaters such as a bar coater (shown in FIG. 1), an extrusion coater, and a slide bead coater can be used. In the bar coater shown in FIG. 1, a pair of press rollers 18B and 18C are provided on the opposite side of a bar 18A, with the belt-like support 12 being sandwiched between the bar 18A and the press rollers 18B and 18C. The coating liquid supplied to the coater main body is transferred and applied onto the belt-like support 12 by the rotating bar 18A.

Thus, diffusive mixing between the overcoat layer and the image recording layer can be suppressed effectively by cooling the belt-like support 12 by the second cooling device 30 and cooling the coating liquid for an overcoat layer by the coating liquid cooling device 22.

Next, the belt-like support 12 having the overcoat layer applied onto the image recording layer is initially dried by the initial drying device 26 on the following conditions. Namely, the belt-like support 12 is initially dried by blowing cold air parallel to the surface of the overcoat layer, the cold air having a low temperature of not less than a lower limit in the temperature range of the belt-like support 12 cooled by the support cooling device 30 and not more than the lower limit+30° C. and having a dew point of not more than 5° C. For example, in the case where the temperature of the cooled belt-like support 12 is in the range of 10° C. to 20° C., the temperature of the cold air for initial drying is not less than 10° C. and not more than 40° C. In this case, the air velocity of the cold air is set at the range of 8 to 15 m/sec in the initial dryer 26. In drying by the cold air, in the case where the drying rate is low and the drying time is long, there is a concern that the diffusive mixing between the overcoat layer and the image recording layer gradually progress. Accordingly, the diffusive mixing between the overcoat layer and the image recording layer can be further suppressed by increasing the air velocity of the cold air in the range of 8 to 15 m/sec to increase the drying rate. In addition, in the initial drying, because the cold air is blown parallel to the surface of the overcoat layer, no drying unevenness is produced even at an air velocity of 8 to 15 m/sec.

Moreover, in the initial drying device 26, the overcoat layer is preferably dried until the overcoat layer reaches a set-to-touch state. Here, the set-to-touch state of the overcoat layer means the state where the overcoat layer does not adhere to a finger when the surface of the overcoat layer is touched with the finger. The viscosity of the overcoat layer at this time is approximately $10^8$ to $10^{10}$ poises. Once the overcoat layer is dried to the set-to-touch state, neither of the diffusive mixing between the overcoat layer and the image recording layer occurs any more even if the overcoat layer is dried at a high temperature (for example, at a temperature of not less than 100° C., with heated air having a dew point of 5 to 20° C.) at the next step by the dryer 20 for an overcoat layer.

As mentioned above, initial drying is performed at a high speed by the cold air at a low temperature having a low dew point, instead of hot air drying immediately after applying the overcoat layer onto the image recording layer. For this reason, diffusive mixing between the overcoat layer and the image recording layer can be effectively suppressed during drying the overcoat layer.

Figure 2:
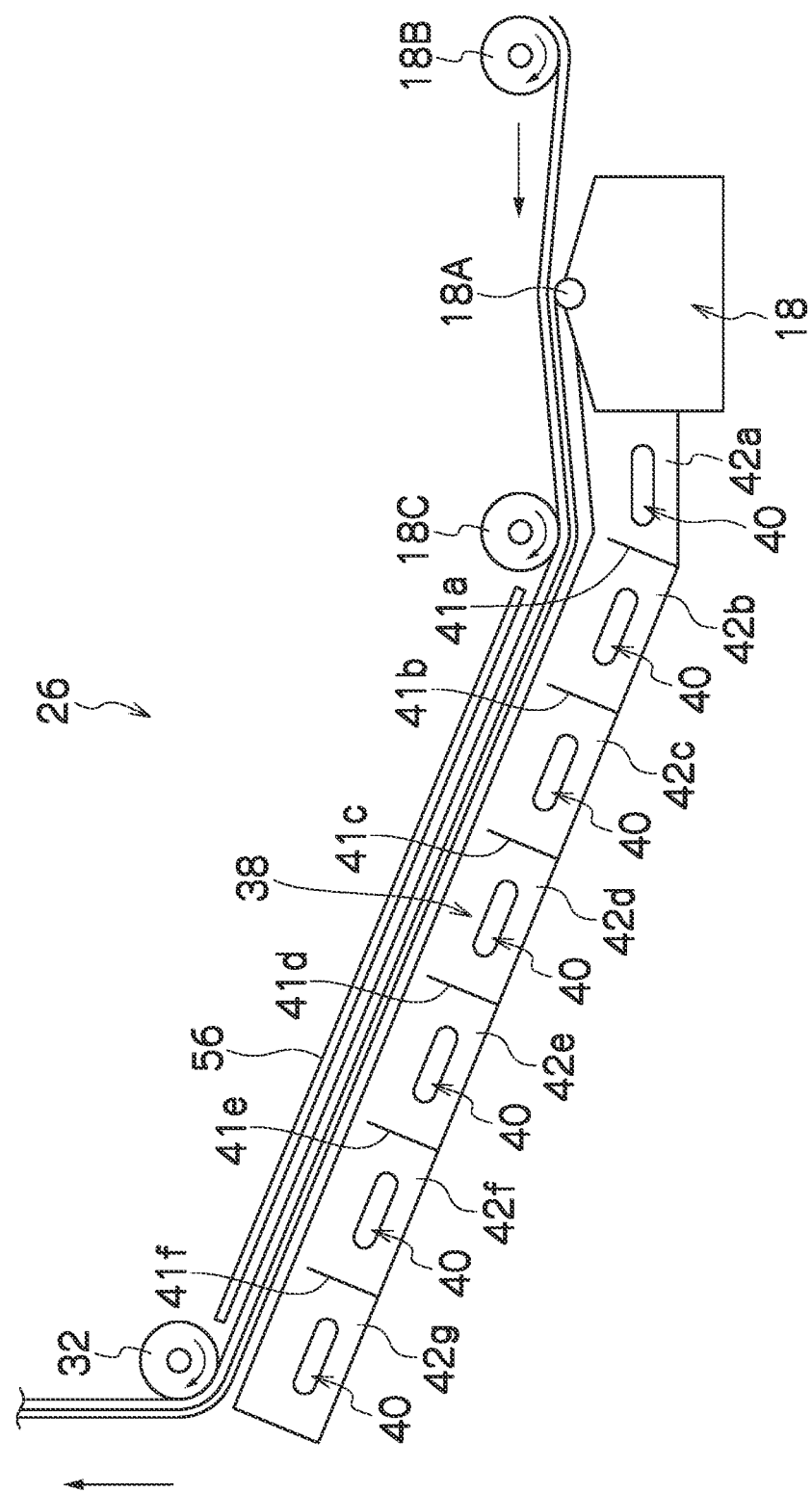
FIG. 2 is a side view showing an example of a configuration of an initial dryer.
Figure 3:
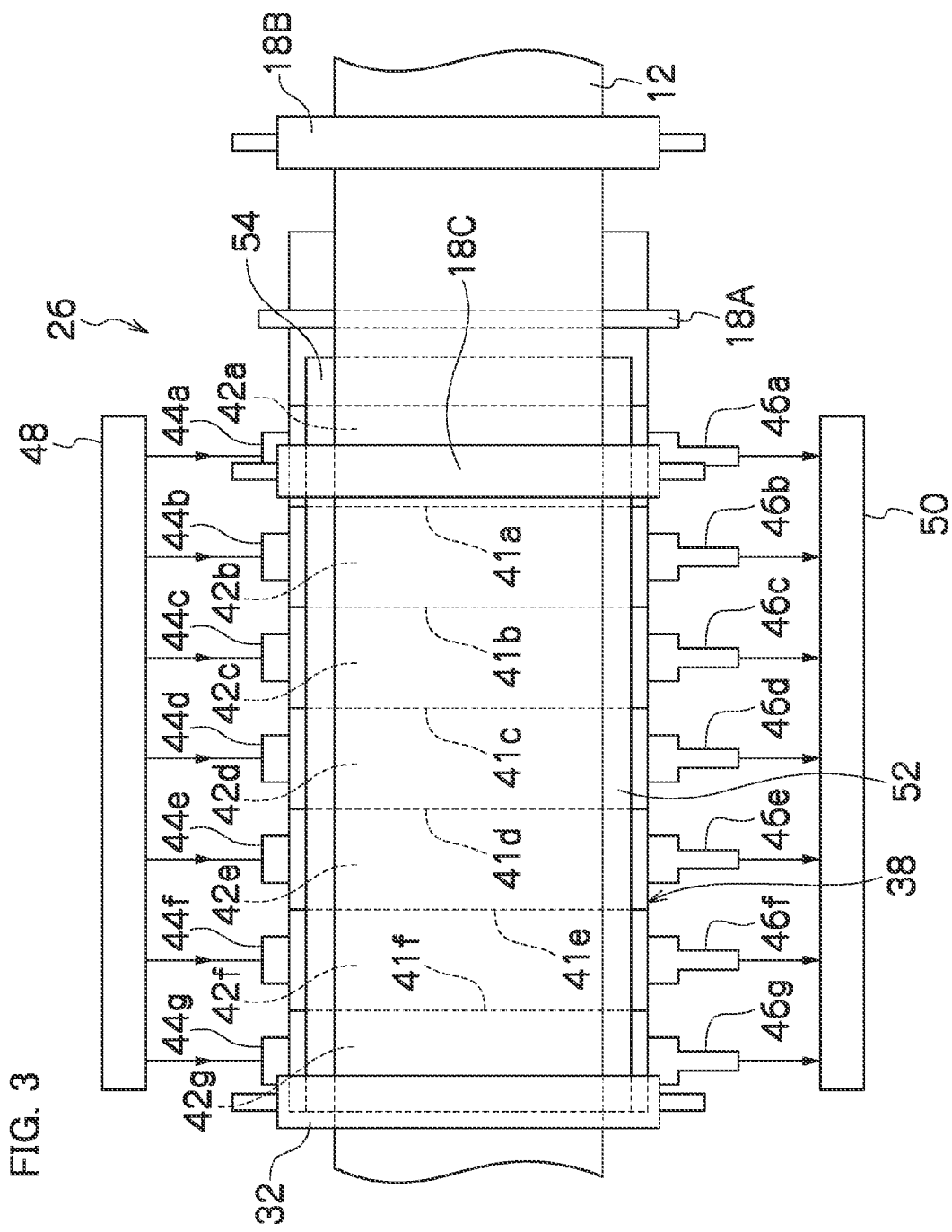
FIG. 3 is a plan view showing an example of a configuration of the initial dryer.

FIGS. 2 and 3 show an example of the initial dryer 26 configured so that unidirectional cold air may flow parallel to the surface of the overcoat layer and in the width direction thereof. This initial dryer 26 is also shown as an example in which the initial dryer 26 is disposed adjacent to the coater 18 for an overcoat layer that applies the coating liquid for an overcoat layer. FIG. 3 is a top view of FIG. 2, and shows the initial dryer 26 with a shield plate described later being removed.

As shown in FIGS. 2 and 3, the initial dryer 26 mainly includes a dryer main body 38 in which a plurality of drying zones are formed, and unidirectional air flow generating devices 40, 40 . . . that generate cold air W having a unidirectional flow that flows from one end of the width direction of the belt-like support to the other end thereof in the respective drying zones.

Then, for the overcoat layer applied by the coater 18 for an overcoat layer to be initially dried by the initial dryer 26 immediately after applying the overcoat layer, the distance between the coater 18 for an overcoat layer and the initial dryer 26 and the traveling speed of the belt-like support 12 are preferably set so that the time from the end of application of the overcoat layer to the start of initial drying may be not more than 10 seconds, preferably not more than 5 seconds, and particularly preferably not more than 1 second.

The dryer main body 38 is formed into a long rectangular box shape along the surface side of the overcoat layer on the traveling belt-like support 12 (the bottom surface side of the belt-like support 12). Of the respective sides of the box, the sides (top surface in FIG. 4) on the surface side of the overcoat layer are cut away. Thereby, a drying zone having an approximately U-shaped cross section surrounding the overcoat layer applied onto the traveling belt-like support 12 is formed. The drying zone is divided into a plurality of drying zones 42a, 42b, 42c, 42d, 42e, 42f, and 42g (although an example of seven divided zones is shown in the present embodiment, the number of division is not limited to this) by separating the dryer main body 38 with a plurality of partition plates 41a to 41f intersecting perpendicularly to the traveling direction of the belt-like support 12. In this case, the distance between an upper end of the partition plates 40a to 40f that divide the drying zone into the drying zones 42a to 42g and the surface of the overcoat layer is preferably in the range of 0.5 mm to 12 mm, and more preferably in the range of 1 mm to 10 mm. Moreover, unidirectional air flow generating devices 40, 40 . . . are provided in the respective drying zones 42a to 42g.

As shown in FIG. 3, unidirectional air flow generating devices 40, 40 . . . mainly include inlet ports 44a to 44g formed on one side of the both sides of the dryer main body 38, outlet ports 46a to 46g formed on the other side opposing to the inlet ports 44a to 44g, a cold air temperature control device 48 connected to the respective inlet ports 44a to 44g, and an exhaust device 50 connected to the respective outlet ports 46a to 46g. The cold air temperature control device 48 is configured so as to be able to adjust the temperature of the cold air supplied to the respective drying zones 42a to 42g for each of the drying zones 42a to 42g. Thereby, by driving the exhaust device 50, the cold air sucked through the inlet ports 44a to 44g into the respective drying zones 42a to 42g is exhausted through the outlet ports 46a to 46g. As a result, the cold air that flows unidirectionally from one end of the width direction of the belt-like support 12 (inlet port side) to the other end thereof (outlet port side) is generated in the respective drying zones 42a to 42g. The unidirectional air flow generating devices 40, 40 . . . are configured to be able to control an amount of exhaust (air velocity) for each of the drying zones 42a to 42g by the exhaust device 50.

As for the cold air sucked through the inlet ports 44a to 44g, the cold air having a low temperature of not less than the temperature T of the belt-like support 12 cooled by the support cooling device 30 and not more than T1+30° C. and a dew point of not more than 5° C. is blown so that the air velocity may be in the range of 8 to 15 m/sec.

Preferably, the dryer body 38 is formed so as to have a width larger than that of the belt-like support 12, and air adjusting portions are provided in which open portions on the both side of the drying zones 42a to 42g are covered with cover plates 52 and 54. By the air adjusting portions, the distance from the inlet ports 44a to 44g to the one end of the width direction of the overcoat layer and the distance from the other end of the width direction of the overcoat layer to the outlet ports 46a to 46g are ensured. Simultaneously, the air adjusting portions make it easier for the cold air to be sucked only through the inlet ports 44a to 44g into the drying zones 42a to 42g. This prevents any flow other than the cold air having a unidirectional flow in the width direction of the belt-like support to be generated in the drying zones 42a to 42g. The length of the air adjusting portions, namely, the cover plates 52 and 54 are preferably in the range of not less than 50 mm and not more than 150 mm on both of the inlet port side and the outlet port side.

It is preferable that particularly in the drying zone 42a nearest to the coater 18 for an overcoat layer among the respective drying zones 42a to 42g, warm air outside the drying zone 42a, for example, an air-conditioning wind in a room in which the coater 18 for an overcoat layer and the initial dryer 26 are installed hardly enter the drying zone 42a for immediately after applying the coating liquid for an overcoat layer onto the belt-like support 12. For this purpose, the drying zone 42a at the first stage is preferably disposed adjacent to the coater 18 for an overcoat layer. Also, preferably, a shield plate 56 (see FIG. 2) is provided on the opposite side of the dryer main body 38 with the belt-like support 12 being sandwiched between the shield plate 56 and the dryer main body 38 in a manner that stable traveling of the belt-like support 12 may be inhibited by a wind such as the air-conditioning wind.

Figure 4:
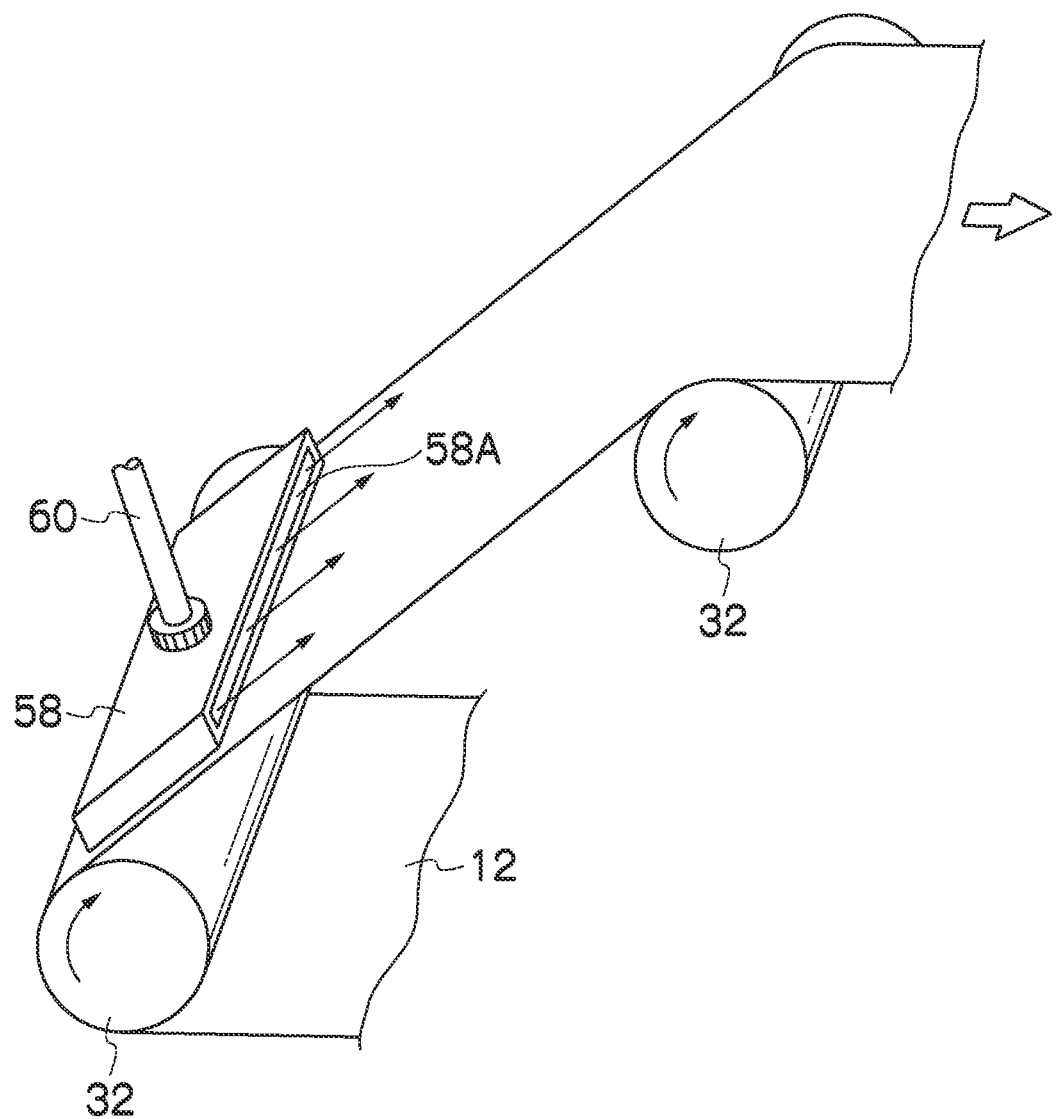
FIG. 4 is a schematic view showing another aspect of the initial dryer.

FIG. 4 shows another aspect of the initial dryer 26, and shows a case where the cold air is blown parallel to the surface of the overcoat layer and in the traveling direction of the belt-like support.

As shown in FIG. 4, a rectangular nozzle 58 is provided close to the surface of the overcoat layer applied onto the image recording layer by the coater 18 for an overcoat layer. A feeding pipe 60 connecting to a cooling air feeder is connected with the nozzle 58 to supply the cold air having a low temperature of not less than the temperature T2 of the belt-like support 12 cooled by the support cooling device 30 and not more than T1+30° C. and a dew point of not more than 5° C. to the nozzle 58. A slit-like blow-off opening 58A formed to have approximately the same width as that of the belt-like support 12 is formed in the nozzle 58 parallel to the surface of the overcoat layer and facing in the traveling direction of the belt-like support. Then, the cold air having the low temperature and the low dew point described above is blown from the nozzle 58 at an air velocity of 8 to 15 m/sec parallel to the surface of the overcoat layer and in the traveling direction of the belt-like support.

As described above, according to the method for producing a lithographic printing plate and the production apparatus 10 according to the presently disclosed subject matter, developing properties and print durability important for quality of the lithographic printing plate can be improved because the overcoat is applied and dried so that the image recording layer and the overcoat layer may be hardly mixed.

The presently disclosed subject matter is particularly effective in the case where the image recording layer is an image recording layer on which an image can be formed by supplying at least one of the printing ink and dampening water on a printer after exposure to remove an unexposed portion. Further, the presently disclosed subject matter is particularly effective in the case where the overcoat layer contains a water soluble polymer such as polyvinyl alcohol. Further, the presently disclosed subject matter is particularly effective in the case where the overcoat layer contains a lamellar compound such as mica.

Thereby, the on-press developing properties of the lithographic printing plate in which an image recording layer of an unexposed portion can be removed on the printer by an ink and/or dampening water can be improved.

Hereinafter, the image recording layer, the overcoat layer, the belt-like support, a method for platemaking, and the like that can be preferably used for or applied to the embodiment of the invention will be described.

[Content of Image Recording Layer]

Components of the image recording layer will be described in detail.

The image recording layer used for the presently disclosed subject matter is preferably an image recording layer that is on-press developable. Examples of a typical on-press developable image forming aspect that is contained in the image recording layer include (1) an aspect containing (A) a sensitizing dye, (B) a radical polymerization initiator, and (C) a radical polymerizable compound, and using a polymerization reaction to cure an image area. For example, (1) a radical-polymerizable image recording layer may contain (D) a hydrophobing precursor. This is particularly effective in the case where an infrared absorbing dye is used as the sensitizing dye.

Hereinafter, each of the components that can be contained in the image recording layer will be described in turn.

(A) Sensitizing Dye

The sensitizing dye used for the image recording layer of the presently disclosed subject matter can be used without any particular limitation as long as the sensitizing dye is excited by absorbing light when an image is exposed, and supplies the polymerization initiator described later with energy by electron transfer, energy transfer, heat generation, or the like to improve polymerization initiation function. Particularly, a sensitizing dye having local maximum absorption at 300 to 450 nm or 750 to 1400 nm is preferably used.

Examples of the sensitizing dye having local maximum absorption at a wavelength of 300 to 450 nm include merocyanine dyes, benzopyrans, coumarins, aromatic ketones, and anthracenes.

Of the sensitizing dye having local maximum absorption at a wavelength of 360 to 450 nm, from the viewpoint of high sensitivity, more preferable pigments are a pigment represented by the following general formula (I):

[Formula (I)]

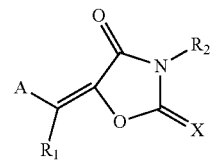

(wherein A represents an aromatic ring group or heterocyclic group that may have a substituent, and X represents an oxygen atom, a sulfur atom, or N—($R_3$); $R_1$, $R_2$, and $R_3$ each independently represent a monovalent nonmetallic atomic group; A and $R_1$ may be bonded to each other and $R_2$ and $R_3$ may be bonded to each other to form an aliphatic or aromatic ring.)

The general formula (I) will be described in more detail. $R_1$, $R_2$, and $R_3$ are each independently a monovalent nonmetallic atomic group, and preferably represent a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxyl group, or a halogen atom.

Next, A in the general formula (I) will be described. A represents an aromatic ring group or a heterocyclic group that may have a substituent. Specific examples of the aromatic ring group or the heterocyclic group that may have a substituent include the same groups as those in the case of description about $R_1$, $R_2$, and $R_3$ in the general formula (I).

As a specific example of such a sensitizing dye, a compound described in [0047] to [0053] of Japanese Patent Laid-Open No. 2007-58170 is preferably used.

Further, sensitizing dyes represented by the following general formulas (II) and (III) can also be used:

[Formulas (II) and (III)]

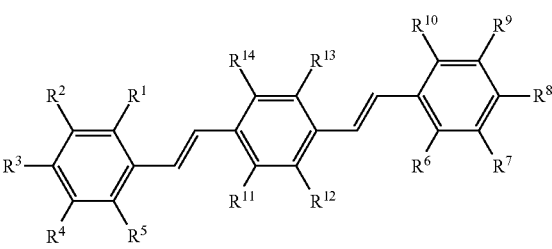

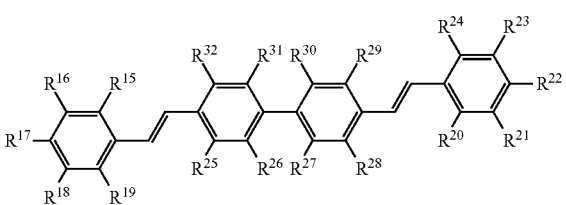

In the formula (II), $R^1$ to $R^{14}$ each independently represents a hydrogen atom, an alkyl group, an alkoxy group, a cyano group, or a halogen atom. However, at least one of $R^1$ to $R^{10}$ represents an alkoxy group having two or more carbon atoms.

In the formula (III), $R^{15}$ to $R^{32}$ each independently represents a hydrogen atom, an alkyl group, an alkoxy group, a cyano group, or a halogen atom. However, at least one of $R^{15}$ to $R^{24}$ represents an alkoxy group having two or more carbon atoms.

Moreover, the sensitizing dye described in Japanese Patent Laid-Open Nos. 2007-171406, 2007-206216, 2007-206217, 2007-225701, 2007-225702, 2007-316582, 2007-328243 can also be preferably used.

Subsequently, the sensitizing dye having local maximum absorption at 750 to 1400 nm and suitably used in the presently disclosed subject matter (hereinafter, sometimes referred to as an "infrared absorbing agent") will be described in detail. As the infrared absorbing agent, a dye or a pigment is preferably used.

The infrared absorbing dye has function to convert absorbed infrared rays into heat, and function to be excited by infrared rays to transfer electrons and/or energy to the radical polymerization initiator mentioned later. The infrared absorbing dye used in the presently disclosed subject matter is a dye having the absorption local maximum at a wavelength of 760 to 1200 nm.

As the infrared absorbing dye, the compound described in paragraph numbers to [0087] of Japanese Patent Laid-Open No. 2008-195018 can be used.

Of these dyes, particularly preferable examples thereof include cyanine dyes, squarylium pigments, pyrylium salts, and nickel thiolate complexes. Particularly preferable examples thereof include a cyanine dye represented by the following general formula (a):

General formula (a)

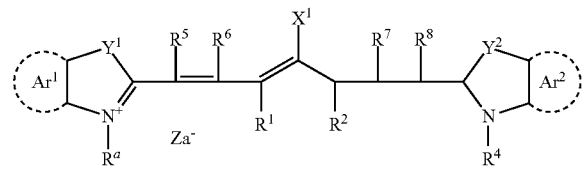

wherein $X^1$ represents a hydrogen atom, a halogen atom, $-N(R^9)(R^{10})$, $-X^2-L^1$, or a group represented by the general formula (a) below.

Here, $R^9$ and $R^{10}$ may be the same or different from each other, and each represent an aromatic hydrocarbon group having 6 to 10 carbon atoms (carbon number) that may have a substituent, an alkyl group having 1 to 8 carbon atoms, or a hydrogen atom. $R^9$ and $R^{10}$ may be bonded to each other to form a ring. Of these, a phenyl group is preferable. $X^2$ represents an oxygen atom or a sulfur atom. $L^1$ represents a hydrocarbon group having 1 to 12 carbon atoms, an aromatic ring having a hetero atom, or a hydrocarbon group having 1 to 12 carbon atoms and containing a hetero atom. Here, the hetero atom represents N, S, O, a halogen atom, or Se. In the group represented below, $X_a-$ is as defined as $Z_a-$ described later, and $R_a$ represents a substituent selected from a hydrogen atom, an alkyl group, an aryl group, a substituted or unsubstituted amino group, and a halogen atom:

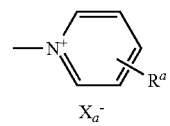

Wherein, $R^1$ and $R^2$ each independently represent a hydrocarbon group having 1 to 12 carbon atoms. For preservation stability of the coating liquid for an image recording layer, $R^1$ and $R^2$ are preferably a hydrocarbon group having two or more carbon atoms. Further, $R^1$ and $R^2$ are particularly preferably bonded to each other to form a five membered-ring or a six membered-ring.

$Ar^1$ and $Ar^2$ may be the same or different from each other, and each represent an aromatic hydrocarbon group that may have a substituent. Preferable examples of the aromatic hydrocarbon group include a benzene ring and a naphthalene ring. Preferable examples of the substituent include a hydrocarbon group having not more than 12 carbon atoms, a halogen atom, and an alkoxy group having not more than 12 carbon atoms. $Y^1$ and $Y^2$ may be the same or different from each other, and each represent a sulfur atom or a dialkyl methylene group having not more than 12 carbon atoms. $R^3$ and $R^4$ may be the same or different from each other, and each represent a hydrocarbon group having not more than 20 carbon atoms that may have a substituent. Preferable examples of the substituent include an alkoxy group having not more than 12 carbon atoms, a carboxy group, and a sulfonic group. $R^5$, $R^6$, $R^7$, and $R^8$ may be the same or different from each other, and each represent a hydrogen atom or a hydrocarbon group having not more than 12 carbon atoms. The hydrogen atom is preferable for availability of the raw material. $Z_a-$ represents a counter anion. However, $Z_a-$ is unnecessary in the case where the cyanine dye represented by the general formula (a) has an anionic substituent in the structure and neutralization of charges is unnecessary. For preservation stability of the coating liquid for an image recording layer, preferable examples of $Z_a-$ include halide ions, a perchlorate ion, a tetrafluoroborate ion, a hexafluorophosphate ion, and a sulfonate ion. The perchlorate ion, the hexafluorophosphate ion, and aryl sulfonate ions are particularly preferable.

Specific examples of the cyanine dye represented by the general formula (a) that can be suitably used in the presently disclosed subject matter include those described in paragraph numbers [0017] to [0019] of Japanese Patent Laid-Open No. 2001-133969, paragraph numbers [0012] to [0021] of Japanese Patent Laid-Open No. 2002-023360, and paragraph numbers [0012] to [0037] of Japanese Patent Laid-Open No. 2002-040638.

Only one of these (A) infrared absorbing dyes may be used, two or more thereof may be used in combination. An infrared absorbing agent other than the infrared absorbing dyes such as a pigment may be used in combination. As a pigment, the compound described in [0072] to [0076] of Japanese Patent Laid-Open No. 2008-195018 is preferable.

The content of the sensitizing dye in the image recording layer in the presently disclosed subject matter is preferably 0.1 to 10.0% by mass and more preferably 0.5 to 5.0% by mass, based on the total solid of the image recording layer.

(B) Radical Polymerization Initiator

The (B) radical polymerization initiator used for the presently disclosed subject matter is a compound that starts and accelerates polymerization of the (C) radical polymerizable compound. As the radical polymerization initiator that can be used in the presently disclosed subject matter, known thermal polymerization initiators, compounds having bonds having low bond dissociation energy, and photopolymerization initiators and the like can be used.

Examples of the radical polymerization initiator in the presently disclosed subject matter include (a) organic halogenated compounds, (b) carbonyl compounds, (c) azo compounds, (d) organic peroxides, (e) metallocene compounds, (f) azide compounds, (g) hexaaryl biimidazole compounds, (h) organic borate compounds, (i) disulfone compounds, (j) oxime ester compounds, and (k) onium salt compounds.

As the (a) organic halogenated compounds, the compound described in paragraph numbers [0022] and [0023] of Japanese Patent Laid-Open No. 2008-195018 is preferable.

As the (b) carbonyl compounds, the compound described in paragraph number of Japanese Patent Laid-Open No. 2008-195018 is preferable.

As the (c) azo compounds, the azo compound described in Japanese Patent Laid-Open No. 08-108621 can be used, for example.

As the (d) organic peroxides, the compound described in paragraph number of Japanese Patent Laid-Open No. 2008-195018 is preferable, for example.

As the (e) metallocene compounds, the compound described in paragraph number [0026] of Japanese Patent Laid-Open No. 2008-195018 is preferable, for example.

Examples of the (f) azide compounds can include compounds such as 2,6-bis(4-azidebenzylidene)-4-methylcyclohexanone.

As the (g) hexaaryl biimidazole compounds, the compound described in paragraph number [0027] of Japanese Patent Laid-Open No. 2008-195018 is preferable, for example.

As the (h) organic borate compounds, the compound described in paragraph number [0028] of Japanese Patent Laid-Open No. 2008-195018 is preferable, for example.

Examples of the (i) disulfone compounds include the compound described in Japanese Patent Laid-Open No. 61-166544, Japanese Patent Laid-Open No. 2002-328465, and the like.

As the (j) oxime ester compounds, the compound described in paragraph numbers [0028] to [0030] of Japanese Patent Laid-Open No. 2008-195018 is preferable, for example.

Examples of the (k) onium salt compounds include the diazonium salts described in S. I. Schlesinger, Photogr. Sci. Eng., 18,387 (1974), and T. S. Bal et al, Polymer, 21,423 (1980); the ammonium salts described in U.S. Pat. No. 4,069,055, Japanese Patent Laid-Open No. 04-365049, and the like; the phosphonium salts described in U.S. Pat. Nos. 4,069,055 and 4,069,056; the iodonium salts described in European Patent No. 104,143, U.S. Pat. Nos. 339,049, 410,201, U.S. Patent Application No. 2008-0311520, Japanese Patent Laid-Open Nos. 02-150848, 02-296514, and 2008-195018; the sulfonium salts described in European Patent Nos. 370,693, 390,214, 233,567, 297,443, and 297,442, U.S. Pat. Nos. 4,933,377, 161,811, 410,201, 339,049, 4,760,013, 4,734,444, and 2,833,827, German Patent Nos. 2,904,626, 3,604,580, and 3,604,581; the selenonium salts described in J. V. Crivello et al, Macromolecules, 10(6), 1307 (1977), and J. V. Crivello et al, J. Polymer Sci., Polymer Chem. Ed., 17, 1047 (1979); the arsonium salt described in C. S. Wen et al, Teh, Proc. Conf, Rad. Curing ASIA, p. 478, Tokyo, October (1988); and the onium salts such as an azinium salt described in Japanese Patent Laid-Open No. 2008-195018.

Of these, more preferable examples include the onium salts, and particularly an iodonium salt, a sulfonium salt, and an azinium salt. Specific examples of these compounds will be shown below, but not limited to these.

As an example of the iodonium salt, a diphenyliodonium salt is preferable. A diphenyliodonium salt substituted by an electron releasing group, e.g., an alkyl group, or an alkoxyl group is particularly preferable. An unsymmetrical diphenyliodonium salt is more preferable. Specific examples thereof include diphenyliodonium hexafluorophosphate, 4-methoxyphenyl-4-(2-methylpropyl)phenyliodonium hexafluoro phosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate, and bis(4-t-butylphenyl)iodonium tetraphenylborate.

Examples of the sulfonium salt include triphenylsulfonium hexafluorophosphate, triphenylsulfonium benzoylholmate, bis(4-chlorophenyl)phenylsulfonium benzoylholmate, bis(4-chlorophenyl)-4-methylphenylsulfonium tetrafluoroborate, and tris(4-chlorophenyl)sulfonium 3,5-bis(methoxycarbonyl)benzenesulfonate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide, and 1-(2-ethylhexyloxy)-4-phenylpyridinium tetrafluoroborate.

The radical polymerization initiator can be added preferably in a proportion of 0.1 to 50% by mass, more preferably in a proportion of 0.5 to 30% by mass, and particularly preferably in a proportion of 0.8 to 20% by mass, based on the total solid that forms the image recording layer. In this range, favorable sensitivity and favorable dirt resistance in the non-image area during printing are obtained.

(C) Radical Polymerizable Compound

The (C) radical polymerizable compound that can be used for the presently disclosed subject matter is an addition polymerizable compound having at least one ethylenically unsaturated double bond, and is preferably selected from the compounds having at least one terminal ethylenically unsaturated bond and preferably not less than two thereof. Such compound groups are widely known in the field of industry, and these can be used without particular limitation in the presently disclosed subject matter. These compounds mean a monomer, a prepolymer, i.e., a dimer, a trimer, and an oligomer, for example. These compounds are a polymerizable compound having a molecular weight of not more than 1000.

Specific examples thereof include the compound described in paragraph numbers [0089] to [0098] of Japanese Patent Laid-Open No. 2008-105018. Of these, preferable examples thereof include esters of an aliphatic polyhydric alcohol compound and an unsaturated carboxylic acid (for example, acrylate, methacrylic acid, itaconic acid, crotonic acid, isocrotonic acid, and maleic acid). Another preferable example of the radical polymerizable compound includes a polymerizable compound having an isocyanuric acid structure described in Japanese Patent Laid-Open No. 2005-329708.

Of these, ethylene oxide isocyanurate modified acrylates such as tris(acryloyloxyethyl)isocyanurate and bis(acryloyloxyethyl)hydroxyethylisocyanurate are particularly preferable for an excellent balance between hydrophilicity related to on-press developing properties and a polymerization ability related to print durability.

In the presently disclosed subject matter, the (C) radical polymerizable compound is used preferably in the range of 5 to 80% by mass and more preferably 15 to 75% by mass, based on the total solid of the image recording layer.

(D) Hydrophobing Precursor

In the presently disclosed subject matter, a hydrophobing precursor can be used in order to particularly improve on-press developing properties. The hydrophobing precursor in the presently disclosed subject matter means particulates that can convert the nature of the image recording layer into a hydrophobic state when heat is applied. As the particulates, at least one particulate selected from hydrophobic thermoplastic polymer particulates, thermally reactive polymer particulates, a microcapsule that encapsulates a hydrophobic compound, and micro gels (crosslinked polymer particulates) is preferable. Of these, polymer particulates having a polymerizable group and micro gels are preferable.

Examples of suitable hydrophobic thermoplastic polymer particulates can include the hydrophobic thermoplastic polymer particulates described in Research Disclosure No. 33303, January, 1992, Japanese Patent Laid-Open Nos. 09-123387, 09-131850, 09-171249, 09-171250, European Patent No. 931647, and the like.

Specific examples of the polymer that forms such a polymer particulate can include a homopolymer and a copolymer of a monomer such as ethylene, styrene, vinyl chloride, methylacrylate, ethylacrylate, methylmethacrylate, ethylmethacrylate, vinylidene chloride, acrylonitrile, vinylcarbazole, and acrylate and methacrylate having a polyalkylene structure; and a mixture thereof. Of these, more suitable examples thereof can include copolymers containing polystyrene, styrene, and acrylonitrile, and polymethylmethacrylates.

The average particle size of the hydrophobic thermoplastic polymer particulate used for the presently disclosed subject matter is preferably 0.01 to 2.0 µm.

Examples of the thermally reactive polymer particulates used for the presently disclosed subject matter include polymer particulates having a thermally reactive group. These form a hydrophobing region by crosslinking due to a thermal reaction and a resulting change in a functional group.

The thermally reactive group in the polymer particulate having a thermally reactive group used in the presently disclosed subject matter may be a functional group that makes any reaction, as long as a chemical bond is formed. Suitable examples of the thermally reactive group can include ethylenically unsaturated groups that make a radical polymerization reaction (for example, an acrylyl group, a methacryloyl group, a vinyl group, an aryl group); cationic polymerizable groups (for example, a vinyl group, a vinyloxy group); an isocyanate group that makes an addition reaction and a block copolymer thereof; an epoxy group, a vinyloxy group, and functional groups having an active hydrogen atom reactive with the epoxy group and the vinyloxy group (for example, an amino group, a hydroxy group, a carboxy group); a carboxy group that makes a condensation reaction and a hydroxy group and an amino group that are reactive with the carboxy group; and acid anhydrides that make a ring opening addition reaction, and an amino group and an hydroxy group that are reactive with the acid anhydrides.

The microcapsule used in the presently disclosed subject matter encapsulates all or part of components of the image recording layer in the microcapsule, as described in Japanese Patent Laid-Open No. 2001-277740 and Japanese Patent Laid-Open No. 2001-277742, for example. The component of the image recording layer can also be contained outside of the microcapsule. Further, as a preferable aspect, the image recording layer containing the microcapsule encapsulates a hydrophobic component in the microcapsule, and contains a hydrophilic component outside of the microcapsule.

In the presently disclosed subject matter, the image recording layer may have an aspect containing crosslinking resin particles, i.e., a micro gel. The micro gel can contain a part of the components of the image recording layer within the micro gel and/or on the surface of the micro gel. Particularly, an aspect of a reactive micro gel obtained by containing the (C) radical polymerizable compound on the surface of the micro gel is particularly preferable from the viewpoint of image formation sensitivity and print durability.

As a method for microencapsulating or microgelling the components of the image recording layer, known methods can be used.

The average particle size of the microcapsule and that of the micro gel are preferably 0.01 to 3.0 µm, more preferably 0.05 to 2.0 µm, and particularly preferably 0.10 to 1.0 µm. Favorable resolution and stability over time are obtained at an average particle size in this range.

The content of the hydrophobing precursor is preferably in the range of 5 to 90% by mass based on the total solid of the image recording layer.

(E) Other Components

The image recording layer can further contain other components when necessary.

(1) Binder Polymer

A binder polymer can be used for the image recording layer of the presently disclosed subject matter in order to improve film strength of the image recording layer. Conventionally known binder polymers can be used for the binder polymer that can be used for the presently disclosed subject matter without limitation, and polymers having coating properties are preferable. Of these, acrylic resins, polyvinyl acetal resins, and polyurethane resins are preferable.

Of these, examples of the binder polymers suitable for the presently disclosed subject matter include those including a crosslinkable functional group for improving film strength of the image area in the main chain or the side chain, and preferably in the side chain, as described in Japanese Patent Laid-Open No. 2008-195018. Crosslinking is formed between polymer molecules by the crosslinkable group so that curing is accelerated.

As the crosslinkable functional group, ethylenically unsaturated groups such as a (meth)acrylic group, a vinyl group, and an aryl group, an epoxy group, and the like are preferable. These groups can be introduced into a polymer by a polymer reaction or copolymerization. For example, a reaction of an acrylic polymer or polyurethane having a carboxy group in the side chain with glycidyl methacrylate, or a reaction of a polymer having an epoxy group with an ethylenically unsaturated group containing carboxylic acid such as methacrylic acid can be used.

The content of the crosslinkable group in the binder polymer is preferably 0.1 to 10.0 mmol per gram of the binder polymer, more preferably 1.0 to 7.0 mmol, and most preferably 2.0 to 5.5 mmol.

Preferably, the binder polymer of the presently disclosed subject matter further has a hydrophilic group. The hydrophilic group contributes to giving developing properties to the image recording layer, and particularly giving on-press developing properties in the case of performing on-press development. Particularly, print durability can be compatible with developing properties by coexistence of the crosslinkable group and the hydrophilic group.

Examples of the hydrophilic group include a hydroxy group, a carboxy group, an alkylene oxide structure, an amino group, an ammonium group, an amide group, a sulfonic group, and a phosphate group. Of these, an alkylene oxide structure having 1 to 9 alkylene oxide units with 2 or 3 carbon atoms is preferable. A monomer having the hydrophilic group may be copolymerized to give the hydrophilic group to the binder polymer.

Moreover, a lipophilic group such as an alkyl group, an aryl group, an aralkyl group, and an alkenyl group can be introduced into the binder polymer of the presently disclosed subject matter in order to control ink applicability. Specifically, a lipophilic group containing monomer such as alkyl ester methacrylate may be copolymerized.

Specific examples (1) to (11) of the binder polymer used for the presently disclosed subject matter will be shown below, but the presently disclosed subject matter will not be limited to these:

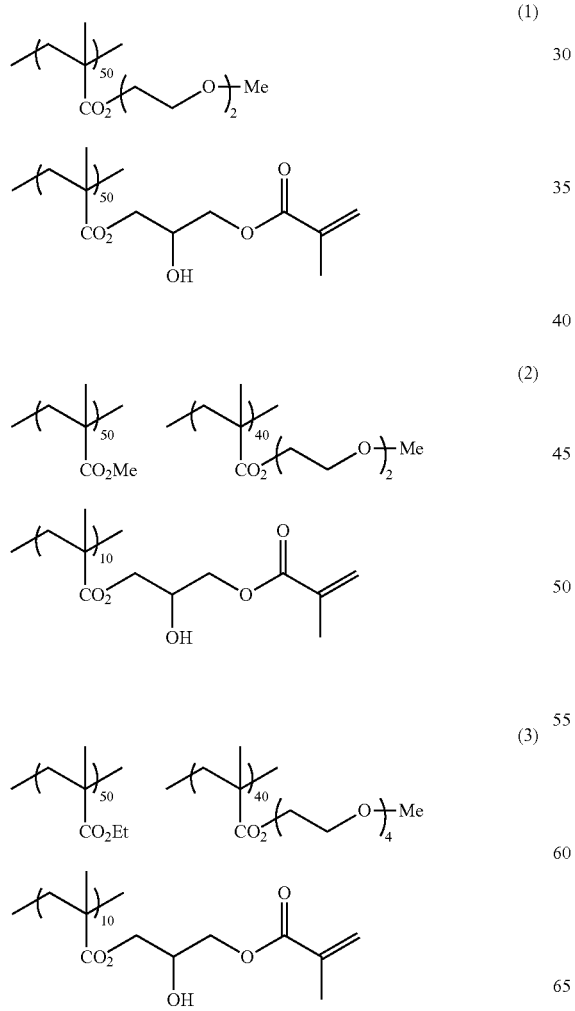

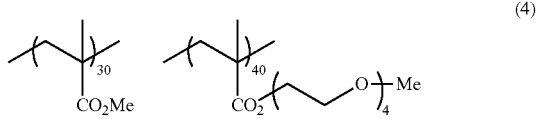

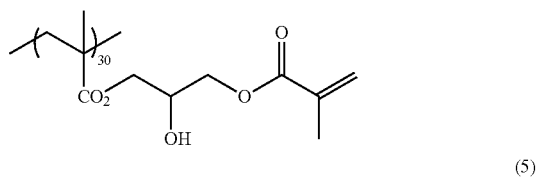

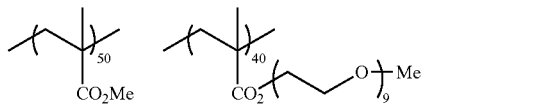

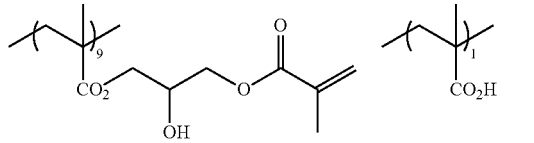

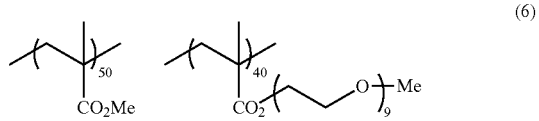

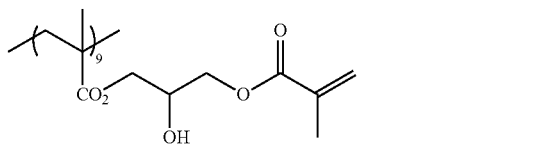

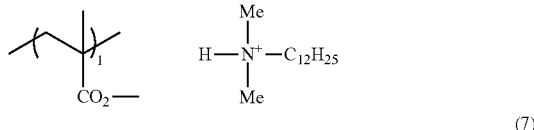

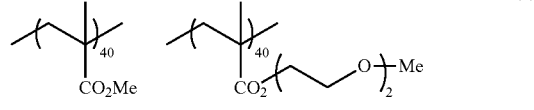

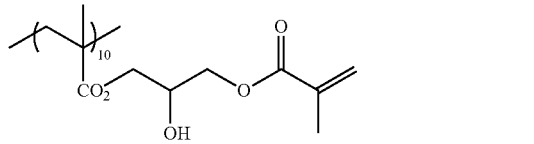

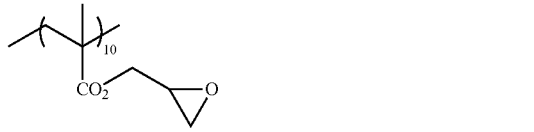

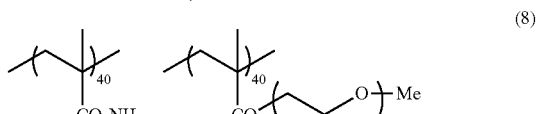

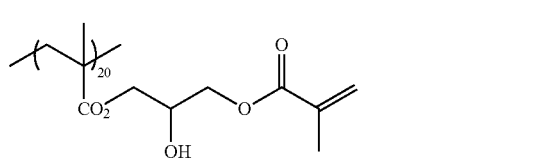

-continued

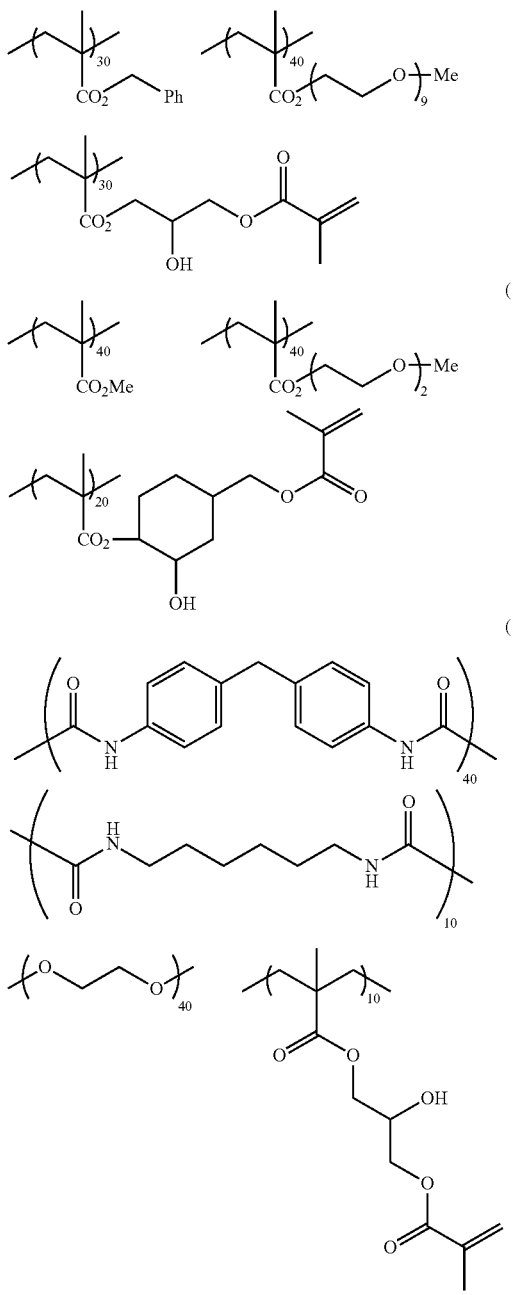

The binder polymer in the presently disclosed matter preferably has a mass average molar mass (Mw) of not less than 2000, more preferably not less than 5000, and still more preferably 10,000 to 300,000.

In the presently disclosed subject matter, a hydrophilic polymer such as polyacrylic acid and polyvinyl alcohol described in Japanese Patent Laid-Open No. 2008-195018 can be used when necessary. A lipophilic binder polymer and a hydrophilic binder polymer can also be used in combination.

The content of the binder polymer is usually 5 to 90% by mass, preferably 5 to 80% by mass, and more preferably 10 to 70% by mass, based on the total solid of the image recording layer.

(2) Low-Molecular Hydrophilic Compound

The image recording layer in the presently disclosed subject matter may contain a low molecular hydrophilic compound in order to improve developing properties and particularly on-press developing properties in the case of performing on-press development, without reducing print durability.

Examples of the low molecular hydrophilic compound, for example a water-soluble organic compound, include glycols such as ethylene glycol, diethylene glycol, triethylene glycol, propylene glycol, dipropylene glycol, and tripropylene glycol, and ethers thereof and ester derivatives thereof; polyhydroxys such as glycerol, pentaerythritol, and tris(2-hydroxyethyl)isocyanurate; organic amines such as triethanolamine, diethanolamine, and monoethanolamine, and salts thereof; organic sulfonic acids such as alkylsulfonic acid, toluenesulfonic acid, and benzenesulfonic acid, and salts thereof; organic sulfamic acids such as alkylsulfamic acid, and salts thereof; organic sulfuric acids such as alkylsulfuric acid and alkylethersulfuric acid, and salts thereof; organic phosphonic acids such as phenylphosphonic acid, and salts thereof; organic carboxylic acids such as tartaric acid, oxalic acid, citric acid, malic acid, lactic acid, gluconic acid, and amino acid, and salts thereof; and betaines.

In the presently disclosed subject matter, of these, at least one selected from the group consisting of polyols, organic sulfate salts, organic sulfonate salts, and betaines is preferably contained.

Specific examples of compounds of the organic sulfonate salts include alkylsulfonates such as sodium n-butylsulfonate, sodium n-hexylsulfonate, sodium 2-ethylhexylsulfonate, sodium cyclohexylsulfonate, and sodium n-octylsulfonate; alkylsulfonate salts including an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, and sodium 5,8,11,14-tetraoxatetradecosane-1-sulfonate; and arylsulfonate salts such as sodium benzenesulfonate, sodium p-toluenesulfonate, sodium p-hydroxybenzenesulfonate, sodium p-styrenesulfonate, sodium dimethyl 5-sulphonatoisophthalate, sodium 1-naphthylsulfonate, sodium 4-hydroxynaphthylsulfonate, disodium 1,5-naphthalenedisulfonate, and trisodium 1,3,6-naphthalenetrisulfonate. The salts may be a potassium salt or a lithium salt.

Examples of the organic sulfate salts include sulfuric acid salts of alkyl, alkenyl, alkynyl, aryl, or heterocyclic monoether of polyethylene oxide. The number of ethylene oxide units is preferably 1 to 4, and the salt is preferably a sodium salt, a potassium salt, or a lithium salt.

As betaines, compounds in which a hydrocarbon substituent to a nitrogen atom has 1 to 5 carbon atoms are preferable. Specific examples of betaines include trimethylammonium acetate, dimethylpropylammonium acetate, 3-hydroxy-4-trimethylammoniobutyrate, 4-(1-pyridinio)butyrate, 1-hydroxyethyl-1-imidazolio acetate, trimethylammonium methanesulfonate, dimethylpropylammonium methanesulfonate, 3-trimethylammonio-1-propanesulfonate, and 3-(1-pyridinio)-1-propanesulfonate.

The above low molecular hydrophilic compounds have a small structure of a hydrophobic portion, and hardly have surface active action. Accordingly, these low molecular hydrophilic compounds prevent hydrophobicity and film strength of an image area from being reduced due to permeation of dampening water through the exposed portion (image area) of the image recording layer. As a result, ink absorbency and print durability of the image recording layer can be favorably maintained.

The amount of these low molecular hydrophilic compounds to be added to the image recording layer is preferably not less than 0.5% by mass and not more than 20% by mass based on the amount of the total solid of the image recording layer. The amount thereof is more preferably not less than 1% by mass and not more than 10% by mass, and still more preferably not less than 2% by mass and not more than 8% by mass. Favorable on-press developing properties and print durability are obtained at amount of the low molecular hydrophilic compound in this range.

These compounds may be used alone, or two or more thereof may be mixed and used.

(3) Oil-Sensitizing Agent

In the image recording layer of the presently disclosed subject matter, in order to improve ink applicability, an oil-sensitizing agent such as phosphonium compounds, nitrogen containing low molecular compounds, and ammonium group containing polymers can be used for the image recording layer. Particularly in the case where an inorganic lamellar compound is contained in the overcoat layer, these compounds function as a surface coating agent for the inorganic lamellar compound, and prevent reduction in ink applicability in the course of printing caused by the inorganic lamellar compound.

Examples of suitable phosphonium compounds can include the phosphonium compound described in Japanese Patent Laid-Open Nos. 2006-297907 and 2007-50660. Specific examples thereof include tetrabuthylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio) heptane sulfate, and 1,9-bis(triphenylphosphonio)nonane naphthalene-2,7-disulfonate.

Examples of the nitrogen containing low molecular compounds include amine salts and quarternary ammonium salts. Examples thereof also include imidazolinium salts, benzoimidazolinium salts, pyridinium salts, and quinolinium salts. Of these, the quarternary ammonium salts and the pyridinium salts are preferable. Specific examples thereof include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate, and benzyldimethyldodecylammonium hexafluorophosphate.

As the ammonium group containing polymer, any polymer may be used as long as the polymer has an ammonium group in a structure thereof. Polymers containing 5 to 80 mol % of (meth)acrylate having an ammonium group in the side chain as a copolymerization component are preferable.

The ammonium salt containing polymers preferably have a value in the range of 5 to 120, more preferably a value in the range of 10 to 110, and particularly preferably a value in the range of 15 to 100, as a reduced specific viscosity (unit: cSt/g/ml) determined by the following measuring method.

<Method for Measuring Reduced Specific Viscosity>

3.33 g (1 g as a solid content) of a 30% by mass polymer solution is weighed into a 20-ml volumetric flask, and the volumetric flask is filled up with N-methyl pyrrolidone. This solution is placed into an Ubbelohde reduced viscosity tube (viscometer constant=0.010 cSt/s), and the time taken for the solution to flow down at 30° C. is measured. The reduction specific viscosity is calculated by a standard method using a formula ("kinematic viscosity"="viscometer constant"× "time (seconds) taken for the liquid to pass through a capillary").

Specific examples of the ammonium group containing polymers will be shown below.

(1) 2-(trimethylammonio)ethylmethacrylate p-toluenesulfonate/3,6-dioxaheptylmethacrylate copolymer (molar ratio of 10/90)
(2) 2-(trimethylammonio)ethylmethacrylate hexafluorophosphate/3,6-dioxaheptylmethacrylate copolymer (molar ratio of 20/80)
(3) 2-(ethyldimethylammonio)ethylmethacrylate p-toluenesulfonate/hexylmethacrylate copolymer (molar ratio of 30/70)
(4) 2-(trimethylammonio)ethylmethacrylate hexafluorophosphate/2-ethylhexylmethacrylate copolymer (molar ratio of 20/80)
(5) 2-(trimethylammonio)ethylmethacrylate methylsulfate/hexylmethacrylate copolymer (molar ratio of 40/60)
(6) 2-(buthyldimethylammonio)ethylmethacrylate hexafluorophosphate/3,6-dioxaheptylmethacrylate copolymer (molar ratio of 20/80)
(7) 2-(buthyldimethylammonio)ethylacrylate hexafluorophosphate/3,6-dioxaheptylmethacrylate copolymer (molar ratio of 20/80)
(8) 2-(buthyldimethylammonio)ethylmethacrylate 13-ethyl-5,8,11-trioxa-1-heptadecanesulfonate/3,6-dioxaheptylmethacrylate copolymer (molar ratio of 20/80)
(9) 2-(buthyldimethylammonio)ethylmethacrylate hexafluorophosphate/3,6-dioxaheptylmethacrylate/2-hydroxy-3-methacryloyloxypropylmethacrylate copolymer (molar ratio of 15/80/5)

The content of the oil-sensitizing agent is preferably 0.01 to 30.0% by mass, more preferably 0.1 to 15.0% by mass, and still more preferably 1 to 5% by mass, based on the total solid of the image recording layer.

(4) Others

Further, as other components, a surface active agent, a coloring agent, a printing-out agent, a polymerization inhibitor, a higher fatty acid derivative, a plasticizer, inorganic particulates, an inorganic lamellar compound, and a co-sensitizer or a chain transfer agent can be added. Specifically, the compounds and the amount of the compound to be added, which are described in paragraph numbers [0114] to [0159] of Japanese Patent Laid-Open No. 2008-284817, paragraph numbers [0023] to [0027] of Japanese Patent Laid-Open No. 2006-091479, and [0060] of U.S. Patent Publication No. 2008/0311520, are preferable.

[Overcoat Layer]

Examples of a water-soluble polymer containing a hydrogen bonding group contained in the overcoat layer include polyvinyl alcohols and partial esters, ethers, and acetals thereof; and copolymers thereof containing a substantial amount of unsubstituted vinyl alcohol units that give water solubility necessary for those above. Examples of the polyvinyl alcohols include those in which 71 to 100 mol % thereof is hydrolyzed and a degree of polymerization is in the range of 300 to 2400. Specifically, examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 made by Kuraray Co., Ltd. Examples of the copolymers include 88 to 100 mol % hydrolyzed polyvinylacetate chloroacetate and propionate, and polyvinyl formal, polyvinyl acetal and copolymers thereof. In addition, examples of other useful polymers include polyvinyl pyrrolidone, gelatin, and gum arabic. These may be used alone or in combination. These water soluble polymers are contained in a proportion of 30 to 99% by mass and preferably in a proportion of 50 to 99% by mass, based on the total solid of the overcoat layer. The overcoat layer may be applied so as to form several layers when necessary.

The overcoat layer may also contain an inorganic lamellar compound. This inorganic lamellar compound is particles having a thin plate-like shape. Examples thereof include a mica group such as natural micas and synthetic micas, talc represented by the general formula $3MgO.4SiO.H_2O$, tainiolite, montmorillonite, saponite, hectorite, and phosphoric acid zirconium.

It is thought that these thin plate-like particles are dispersed in the binder in such a way that the particles overlap each other, and a thin layer made of the inorganic compound is formed in the binder containing the PVA as a principal component, and thus water resistance, oxygen blocking properties, and film strength are further improved.

In the mica group, examples of natural micas include muscovite, paragonite, phlogopite, biotite, and lepidolite. Moreover, examples of the synthetic micas include non-swelling micas such as fluorine phlogopite $KMg_3(AlSi_3O_{10})F_2$ and potassium tetrasilicic mica $KMg_{2.5}(Si_4O_{10})F_2$; and swelling micas such as Na tetrasilicic mica $NaMg_{2.5}(Si_4O_{10})F_2$, Na or Li tainiolite $(Na, Li)Mg_2Li(Si_4O_{10})F_2$, and montmorillonite based Na or Li hectorite $(Na, Li)_{1/8}Mg_{2/5}Li_{1/8}(Si_4O_{10})F_2$. Synthetic smectites are also useful.

Mica compounds are preferable. The amount of the mica compound to be added to the overcoat layer is preferably from 1.0 to 30% by mass and more preferably from 2.0 to 20% by mass, based on the total solid of the overcoat layer.

The overcoat layer may also contain organic resin particulates. Preferably, the organic resin particulates have high affinity with a binder for the overcoat layer (for example, polyvinyl alcohol), and are kneaded well in the overcoat layer without coming off the overcoat layer surface.

Examples of the organic resin particulates having the above properties include poly(meth)acrylate esters; polystyrenes and derivatives thereof; polyamides; polyimides; polyolefins such as low density polyethylenes, high density polyethylenes, and polypropylenes, and copolymers thereof with poval; synthetic resin particulates of polyurethanes, polyureas, and polyesters; and particulates of natural polymers such as chitin, chitosan, cellulose, crosslinking starch, and crosslinking cellulose. Of these, advantages of the synthetic resin particulates include easiness to control a particulates size and easiness to control desired surface properties by surface modification.

The organic resin particulates are preferably those containing a silica component. Of these, silica-coated particulates obtained by coating a part of the surface of the organic resin particulates with a silica layer are particularly preferable. By presence of silica in at least a part of the surface of the organic resin particulates, affinity of the organic resin particulates with the binder (polyvinyl alcohol) is improved, and coming off of the organic resin particulates is suppressed even in the case where an external force is applied to the overcoat layer. Thus, excellent damage resistance and adhesiveness resistance can be maintained.

In the case where the organic resin particulates (silica coating particulates) are contained in the overcoat layer, the amount of the organic resin particulates to be added can be 5 to 1000 $mg/m^2$.

Next, in the belt-like support 12 to which the overcoat layer is applied, the overcoat layer is dried by the dryer 20 for an overcoat layer.

The overcoat layer can be applied by the same method as that used to apply an undercoat, a backcoat layer, and the coating liquid for an image recording layer. Drying of the overcoat layer can also be performed by the same method as that in the case of drying after coating the undercoat, the backcoat layer, and the image recording layer.

The amount of the overcoat layer to be applied is preferably in the range of 0.01 to 10 $g/m^2$, more preferably in the range of 0.02 to 3 $g/m^2$, and most preferably in the range of 0.02 to 1 $g/m^2$, as an amount after drying.

[Belt-Like Support]

As the belt-like support used for the presently disclosed subject matter, dimensionally stable aluminum or an alloy thereof (for example, an alloy with silicon, copper, manganese, magnesium, chromium, zinc, lead, bismuth, or nickel) can be used. Usually, conventionally known materials described in Aruminiumu Handobukku (Aluminum Handbook), fourth edition (1990, published by Japan Light Metal Association), for example, a JIS A1050 material, a JIS A1100 material, a JIS A 3103 material, a JIS A 3004 material, a HS A 3005 material, or alloys obtained by adding not less than 0.1% by mass of magnesium to these materials in order to increase tensile strength are used. In the case of an on-press development type lithographic plate containing a radical polymerizable compound, use of an aluminum alloy having 0.08 to 0.45% by mass of Fe, 0.05 to 0.20% by mass of Si, and not more than 0.05% by mass of an Al—Fe based intermetallic compound is preferable.

In the case where the belt-like support 12 is an aluminum plate, the surface thereof is usually subjected to various treatments in a surface treatment unit according to the purpose. As an ordinary treatment method, first, the aluminum plate is subjected to degreasing or electrolytic polishing treatment, and desmut treatment to clean the aluminum surface. Subsequently, a mechanical surface roughening process and/or an electrochemical surface roughening process are performed to provide fine depressions and projections on the surface of the aluminum plate. A chemical etching process and desmut treatment may be additionally performed at this time. Then, anodizing treatment is performed in order to enhance wear resistance of the surface of the aluminum plate, and then the aluminum surface is subjected to hydrophilization treatment and/or sealing treatment when necessary.

As the support used for the lithographic printing plate of the presently disclosed subject matter, an aluminum plate subjected to a surface roughening process and anodizing treatment by a known method is preferable. When necessary, an expanding treatment and sealing treatment of micropores in an anodic oxidized coating described in Japanese Patent Laid-Open Nos. 2001-253181 and 2001-322365, and surface hydrophilization treatments by alkali-metal silicate described in U.S. Pat. Nos. 2,714,066, 3,181,461, 3,280,734, and 3,902, 734 or by polyvinyl phosphonic acid described in U.S. Pat. Nos. 3,276,868, 4,153,461, and 4,689,272 can be selected properly, and performed on the aluminum plate. Preferably, the support has a center line average roughness of 0.10 to 1.2 μm.

[Backcoat Layer and Undercoat Layer]

On the rear surface of the belt-like support, a coating layer made of an organic polymer compound for preventing scratches of the photosensitive composition layer when the lithographic printing plates are piled up (for example, a backcoat layer containing organic polymer compound described in Japanese Patent Laid-Open No. 05-45885, and an alkoxy compound of silicon described in Japanese Patent Laid-Open No. 05-45885) is provided when necessary.

Moreover, a coating liquid for an undercoat layer can be applied and dried when necessary to form an undercoat layer on the surface of the belt-like support.

The undercoat layer reinforces adhesion of the support to the image recording layer in the exposed portion, and provides easy removal of the image recording layer from the support in the unexposed portion. Accordingly, the undercoat layer contributes to improvement in developing properties without impairing print durability. In the case of exposure by an infrared laser, the undercoat layer functions as a heat insulating layer, thereby preventing reduction in sensitivity caused by diffusion of heat generated by exposure in the support.

Specifically, examples of the compound used for the undercoat layer include a silane coupling agent having an ethylenic double bond reactive group allowing addition polymerization, which is described in Japanese Patent Laid-Open No. 10-282679, and a phosphorus compound having an ethylenic double bond reactive group described in Japanese Patent Laid-Open No. 02-304441. More preferable examples thereof include polymer resins having an adsorptive group that can adsorb to the surface of the support, a hydrophilic group, and a crosslinkable group as described in Japanese Patent Laid-Open No. 2005-125749 and Japanese Patent Laid-Open No. 2006-188038. As such polymer resins, copolymers of monomers having an adsorptive group, monomers having a hydrophilic group, and monomers having a crosslinkable group are preferable. More specifically, examples thereof include polymer resins that are a copolymer of a monomer having an adsorptive group such as a phenol hydroxy group, a carboxy group, $—PO_3H_2$, $—OPO_3H_2$, and $—CONHSO_2—$, $—SO_2NHSO_2—$, and $—COCH_2COCH_3$, a monomer having a hydrophilic sulfonic group, and further a monomer having a polymerizable crosslinkable group such as a methacrylic group and an aryl group. The polymer resin may have a crosslinkable group introduced by formation of a salt by a polar substituent of the polymer resin with a compound having a substituent having a counter charge of the polar substituent and an ethylenically unsaturated bond. Monomers other than the above-mentioned monomers, and preferably a hydrophilic monomer may be further copolymerized.

The content (contained amount) of the unsaturated double bond in the polymer resin for an undercoat layer is preferably 0.1 to 10.0 mmol and most preferably 2.0 to 5.5 mmol, per gram of the polymer resin.

The polymer resin for an undercoat layer preferably has a mass average molar mass of not less than 5000, and more preferably a mass average molar mass of 10,000 to 300,000.

The amount (solid content) of the undercoat layer to be applied is preferably 0.1 to 100 mg/m$^2$, and more preferably 1 to 30 mg/m$^2$.

A method using a coating rod, a method using an extrusion die coater, a method using a slide bead coater, or the like can be used as a method for applying a backcoat layer and an undercoat layer.

As a method for drying a backcoat layer and an undercoat layer applied, the following methods can be used: a method for drying a backcoat layer and an undercoat layer by spraying hot air while lapping and conveying a support with a pass roller disposed in a dryer; a method for drying a backcoat layer and an undercoat layer while lifting up a support by supplying air by a nozzle from the upper and lower sides of the support; a method for drying a backcoat layer and an undercoat layer by radiant heat from a heating plate arranged above and below a belt-like object; or a method for drying a backcoat layer and an undercoat layer by heat conduction caused by contacting a roll with a support, wherein a heating medium is inserted into the roll and heated.

In any of the methods, in order to uniformly dry a belt-like object having a coating liquid applied onto a support, the heating control is performed by properly changing a flow rate of the hot air or the heating medium, the temperature thereof, and a way to flow the hot air or the heating medium according to kinds of the support and the coating liquid, an amount of the coating liquid to be applied, a kind of a solvent, a travel speed, and the like. Two or more drying methods may be used in combination.

[Method for Platemaking]

A lithographic printing plate is produced by performing image exposure and development treatment on the lithographic printing plate in the presently disclosed subject matter. Examples of the development treatment include (1) a method for developing a lithographic printing plate on a printer while adding dampening water and/or an ink (on-press development), and (2) a method for developing a lithographic printing plate with a developing solution, particularly a method for developing a lithographic printing plate with a developing solution prepared in an automatic developer.

<On-Press Development>

Platemaking of the lithographic printing plate according to the presently disclosed subject matter is preferably performed by an on-press development method. The on-press development method includes a step of performing image exposure on the lithographic printing plate, and a printing step of supplying an oily ink and an aqueous ingredient to perform printing without performing any development treatment on the lithographic printing plate after exposure. The on-press development method has a feature that the unexposed portion of the lithographic printing plate is removed in the course of the printing step. Exposure according to an image may be performed on a printer after the lithographic printing plate is attached to the printer, or may be performed separately by a plate setter or the like. In the latter case, the exposed lithographic printing plate is attached to the printer as it is without undergoing the development treatment step. Then, using the printer, an oily ink and an aqueous ingredient are supplied to the lithographic printing plate, and printing is performed as it is. Thereby, the on-press development treatment is performed at an initial stage of printing, namely, the image recording layer of the unexposed region is removed. The surface of the hydrophilic support is exposed by the on-press development treatment to form a non-image area. As the oily ink and the aqueous ingredient, ordinary printing inks and dampening water for lithography are used.

Hereinafter, a more detail description will be made.

As a light source used for image exposure in the presently disclosed subject matter, a laser is preferable. The laser used for the presently disclosed subject matter is not particularly limited. Suitable examples thereof include solid state lasers and semiconductor lasers that perform irradiation with infrared rays at a wavelength of 760 to 1200 nm.

The infrared laser preferably has an output of not less than 100 mW, an exposure time per pixel of not more than 20 microseconds, and an amount of irradiation energy of 10 to 300 mJ/cm$^2$. In the laser, a multi-beam laser device is preferably used in order to reduce an exposure time.

The exposed lithographic printing plate is attached to a printing cylinder of the printer. In the case of the printer provided with a laser exposure apparatus, image exposure is performed after the lithographic printing plate is attached to the printing cylinder of the printer.

When dampening water and a printing ink are supplied to the lithographic printing plate exposed according to an image to perform printing, the image recording layer cured by exposure forms a printing ink absorbing portion having a lipophilic surface in the exposed portion of the image recording layer. On the other hand, in the unexposed portion, a non-cured image recording layer is dissolved or dispersed to be removed by the dampening water and/or printing ink supplied. Then, the hydrophilic surface is exposed in the portion where the image recording layer is removed. As a result, the dampening water adheres to the exposed hydrophilic surface, the printing ink is applied onto the image recording layer of the exposed portion, and printing is started.

Here, the dampening water may be supplied to the printing plate surface first, or the printing ink may be supplied thereto first. Preferably, the printing ink is supplied first from the viewpoint of preventing the dampening water from being contaminated by a component in the removed image recording layer.

As described above, the lithographic printing plate of the presently disclosed subject matter is developed on-press on an offset printer, and used as it is to print a large amount of sheets.

<Method for Developing Lithographic Printing Plate with Developing Solution, Particularly Method for Developing Lithographic Printing Plate with Developing Solution Introduced in Automatic Developer>

The lithographic printing plate produced according to the presently disclosed subject matter can be set on a printer and used to print immediately after the overcoat layer and the image recording layer of the non-exposed portion are removed in a batch by a developing solution, particularly a developing solution at pH of 2 to 11. In the ordinary developing step using an alkali developing solution (1), the overcoat layer is removed at a pre-development washing step, subsequently alkaline development is performed, and the alkali is washed by water and removed at a post-development washing step, followed by gum solution treatment and drying at a drying step. In the presently disclosed subject matter, a surface active agent or a water-soluble polymer compound is preferably contained in the developing solution, and the development treatment and the gum solution treatment are preferably performed simultaneously. Accordingly, the post-development washing step is not particularly needed, either. Preferably, the development treatment and the gum solution treatment are performed with one solution, and then, the drying step is performed. Further, the pre-development washing step is not particularly needed. Removal of the overcoat layer is also preferably performed simultaneously with the development treatment and the gum solution treatment. Preferably, after the development treatment and the gum solution treatment, a squeeze roller is used to remove an excessive developing solution, and then drying is performed. The photosensitive lithographic printing plate in the presently disclosed subject matter is developed according to a conventional method at a temperature of approximately 0 to 60° C. and preferably approximately 15 to 40° C., for example, by a method for immersing a photosensitive lithographic printing plate subjected to exposure treatment in a developing solution, and rubbing the printing plate with a brush, a method for spraying a developing solution to a photosensitive lithographic printing plate with a spray and rubbing the printing plate with a brush, or the like. Processing by such an automatic developer has superiority that the processing eliminates a necessity to treat development scum derived from the overcoat layer/image recording layer, which is produced in the case of the on-press development (1).

The developing solution used in the presently disclosed subject matter is an aqueous solution at pH of 2 to 11. An aqueous solution containing water as a principal component (containing not less than 60% by mass of water) is preferable. Particularly, an aqueous solution containing a surface active agent (e.g. anionic surface active agents, nonionic surface active agents, cationic surface active agents, amphoteric surface active agents) and an aqueous solution containing a water-soluble polymer compound are preferable. An aqueous solution containing both of a surface active agent and a water-soluble polymer compound is also preferable. The pH of the developing solution is more preferably 5 to 10.7, still more preferably 6 to 10.5, and most preferably 7 to 10.3.

Examples of the anionic surface active agent used for the developing solution of the presently disclosed subject matter include, but not particularly limited to, fatty acid salts, abietate salts, hydroxyalkanesulfonate salts, alkanesulfonate salts, dialkylsulfosuccinate salts, linear alkylbenzenesulfonate salts, branched alkylbenzenesulfonate salts, alkylnaphthalenesulfonate salts, alkyldiphenylether(di)sulfonate salts, alkylphenoxypolyoxyethylenepropylsulfonate salts, polyoxyethylenealkylsulfophenylether salts, sodium N-methyl-N-oleyl taurates, disodium N-alkylsulfosuccinic monoamide salts, petroleum sulfonate salts, sulfated castor oil, sulfated beef tallow oil, sulfate ester salts of fatty acid alkyl esters, alkylsulfate ester salts, polyoxyethylenealkylethersulfate ester salts, fatty acid monoglyceride sulfate ester salts, polyoxyethylenealkylphenylethersulfate ester salts, polyoxyethylenestyrylphenylethersulfate ester salts, alkylphosphate ester salts, polyoxyethylenealkyletherphosphate ester salts, polyoxyethylenealkylphenyletherphosphate ester salts, partially saponified products of styrene-maleic anhydride copolymers, partially saponified products of olefin-maleic anhydride copolymers, and naphthalenesulfonate salt formalin condensates. Of these, alkylbenzenesulfonate salts, alkylnaphthalenesulfonate salts, and alkyldiphenylether(di)sulfonate salts are particularly preferably used.

The cationic surface active agent used for the developing solution of the presently disclosed subject matter is not particularly limited, and conventionally known cationic surface active agents can be used. Examples thereof include alkylamine salts, quarternary ammonium salts, polyoxyethylenealkylamine salts, and polyethylenepolyamine derivatives.

Examples of the nonionic surface active agent used for the developing solution of the presently disclosed subject matter include, but not particularly limited to, polyethylene-glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of oils and fats, polypropylene glycol ethylene oxide adducts, dimethylsiloxane ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkylethers of polyhydric alcohol, and fatty acid amides of alkanolamines. Of these, those having an aromatic ring and an ethylene oxide chain are preferable, and alkyl-substituted or unsubstituted phenol ethylene oxide adducts, or alkyl-substituted or unsubstituted naphthol ethylene oxide adducts are more preferable.

Examples of the amphoteric surface active agent used for the developing solution of the presently disclosed subject matter include, but not particularly limited to, those made of amine oxides such as alkyldimethyl amine oxide, those made of betaines such as alkyl betaine, and those made of amino acids such as alkylamino fatty acid sodium.

Particularly, alkyldimethyl amine oxides that may have a substituent, alkylcarboxy betaines that may have a substituent, and alkylsulfobetaines that may have a substituent are preferably used. As specific examples of these, those described in to [0278] of Japanese Patent Laid-Open No. 2008-203359, [0028] to [0052] of Japanese Patent Laid-Open No. 2008-276166, and the like can be used.

Two or more of the surface active agents may be used. A proportion of the surface active agent contained in the developing solution is preferably 0.01 to 20% by mass, and more preferably 0.1 to 10% by mass.

Examples of the water-soluble polymer compound used for the developing solution of the presently disclosed subject matter include soybean polysaccharides, modified starches, gum arabic, dextrin, cellulose derivatives (for example, carboxymethyl cellulose, carboxyethyl cellulose, methylcellulose) and modified products thereof, pullulan, polyvinyl alcohols and derivatives thereof, polyvinyl pyrrolidone, polyacrylamide and acrylamide copolymers, vinylmethyl-ether/maleic acid anhydride copolymers, vinylacetate/maleic acid anhydride copolymers, and styrene/maleic acid anhydride copolymers.

As the soybean polysaccharides, known products can be used. For example, a trade name SOYAFIBE (made by Fuji Oil Co., Ltd.) is available as a commercial product, and those having various grades can be used. The SOYAFIBE that can be preferably used is those having a viscosity of a 10% by mass aqueous solution of 10 to 100 mPa/sec.

Known products can be used for the modified starches. The modified starches can be produced by a method for decomposing a starch such as corn, potato, tapioca, rice, and wheat in the range of 5 to 30 glucose residues per molecule with an acid or an enzyme, and further adding oxypropylene to the decomposed starch in an alkali, or the like.

Two or more of the water-soluble polymer compounds can also be used in combination. The content of the water soluble polymer compound in the developing solution is preferably 0.1 to 20% by mass, and more preferably 0.5 to 10% by mass.

The developing solution used in the presently disclosed subject matter can further contain a pH buffer.

The pH buffer of the presently disclosed subject matter can be used without particular limitation as long as the pH buffer is a buffer that demonstrates a buffer action to keep the pH at 2 to 11. In the presently disclosed subject matter, weak alkaline buffers are preferably used, and examples thereof include (a) a carbonate ion and a bicarbonate ion, (b) a boric acid ion, (c) a water-soluble amine compound and an ion of the amine compound, and a combination thereof. Namely, for example, (a) a combination of the carbonate ion and the bicarbonate ion, (b) the boric acid ion, (c) a combination of the water-soluble amine compound and the ion of the amine compound, or the like demonstrate the pH buffer action in the developing solution. Even if the developing solution is used for a long time, these pH buffers can suppress fluctuation of the pH to suppress reduction in developing properties, production of development scum, and the like caused by fluctuation of the pH. The combination of the carbonate ion and the bicarbonate ion is particularly preferable.

In order to make the carbonate ion and the bicarbonate ion exist in the developing solution, a carbonate salt and a bicarbonate salt may be added to the developing solution, or carbonate ions and bicarbonate ions may be produced by adjusting the pH after adding a carbonate salt or a bicarbonate salt to the developing solution. While the carbonate salt and the bicarbonate salt are not particularly limited, these are preferably an alkali metal salt. Examples of the alkali metal include lithium, sodium, and potassium, and sodium is particularly preferable. These may be used alone, or two or more thereof may be used in combination.

When (a) the combination of the carbonate ion and the bicarbonate ion is used as the pH buffer, the total amount of the carbonate ion and the bicarbonate ion is preferably 0.05 to 5 mol/L, more preferably 0.1 to 2 mol/L, and particularly preferably 0.2 to 1 mol/L, based on the total mass of the aqueous solution.

The developing solution of the presently disclosed subject matter may also contain an organic solvent. Examples of the organic solvent that can be contained include aliphatic hydrocarbons (e.g., hexane, heptane, "Isopars E, H, and G" (made by ExxonMobil Chemical Company), gasoline, kerosene), aromatic hydrocarbons (e.g., toluene, xylene), halogenated hydrocarbons (e.g., methylene dichloride, ethylene dichloride, trichloroethylene, monochlorobenzene), and polar solvents.

Examples of the polar solvents include alcohols (e.g., methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methylphenylcarbinol, n-amyl alcohol, and methyl amyl alcohol); ketones (e.g., acetone, methyl ethyl ketone, ethyl butyl ketone, methyl isobutyl ketone, and cyclohexanone); esters (e.g., ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, and butyl levulinate); and others (e.g., triethyl phosphate, tricresyl phosphate, N-phenylethanolamine, and N-phenyldiethanolamine).

In the case where the organic solvent is insoluble in water, the organic solvent can be used after making the organic solvent soluble in water by using a surface active agent or the like. In the case where the developing solution contains the organic solvent, the concentration of the solvent is desirably less than 40% by mass from the viewpoint of safety and inflammability.

Other than the above-mentioned components, the developing solution of the presently disclosed subject matter can contain an antiseptic, a chelate compound, an antifoaming agent, an organic acid, an inorganic acid, a mineral salt, and the like. Specifically, the compounds described in [0266] to [0270] of Japanese Patent Laid-Open No. 2007-206217 can be preferably used.

The developing solution can be used as a developing solution and a developing replenisher for an exposed negative type lithographic printing plate, and is preferably applied to an automatic processor described later. In the case where the printing plate is developed using such an automatic processor, the developing solution is exhausted according to a throughput. Accordingly, the throughput capacity of the developing solution may be recovered using a replenisher or a fresh developing solution.

The development treatment by the aqueous solution having the pH of 2 to 11 in the presently disclosed subject matter can be suitably performed using an automatic processor provided with a developing solution supply device and a rubbing member. An automatic processor using a rotary brush roll as the rubbing member is particularly preferable.

Preferably, the automatic processor is further provided with a device that removes an excessive developing solution such as a squeeze roller, a drying device such as a warm air apparatus, and the like after the development treatment device.

Besides, in the process of platemaking of a lithographic printing plate according to the lithographic printing plate of the presently disclosed subject matter, the whole surface of the lithographic printing plate may be heated when necessary before exposure, during exposure, or for a period from exposure to development. By such heating, an image forming reaction in the image recording layer is accelerated so that advantages such as improvement in sensitivity and print durability and stabilization of sensitivity may be obtained. In order to improve image strength and print durability, it is also effective to perform post-heating or exposure on the whole image after development. Usually, heating before development is preferably performed on a mild condition of not more than 150° C. An excessively high temperature causes a problem that the unexposed portion is cured, or the like. A very strong condition is used for heating after development. Usually, the temperature is in the range of 100 to 500° C. At a lower temperature, image strength action is not sufficiently obtained, whereas at an excessively high temperature, problems such as deterioration in the support and thermal decomposition of the image area are caused.

Prior to the development treatment, the lithographic printing plate is subjected to laser exposure through a transparent original picture having a line image, a halftone dot image, or the like, or is exposed according to the image by laser beam scanning using digital data, or the like.

As for a desirable wavelength of the light source, a wavelength of 300 nm to 450 nm or that of 750 nm to 1400 nm is preferably used. In the case of the wavelength of 300 to 450 nm, a lithographic printing plate containing a sensitizing dye having an absorption local maximum at a wavelength in this range in the image recording layer is used. In the case of the wavelength of 750 nm to 1400 nm, a lithographic printing plate containing an infrared absorber, which is a sensitizing dye having absorption at a wavelength in this range, is used. As the light source having a wavelength of 300 nm to 450 nm, semiconductor lasers are suitable. As the light source having a wavelength of 750 nm to 1400 nm, solid state lasers and semiconductor lasers that emit infrared rays are suitable. An exposure mechanism may be any of an internal drum type, an external drum type, and a flatbed type.

EXAMPLES

Hereinafter, the presently disclosed subject matter will be described in detail using Examples, but the presently disclosed subject matter will not be limited to these.

[Production of Belt-Like Support]

In order to remove a rolling oil on the surface of an aluminum plate (material JIS A 1050) having a thickness of 0.3 mm, degreasing treatment was performed for 30 seconds at 50° C. using a 10% by mass sodium aluminate aqueous solution. Then, the aluminum surface was grained using three nylon brushes having bundles of bristles whose diameter was 0.3 mm and an aqueous suspension of pumice having a median size of 25 μm (specific gravity of 1.1 g/cm$^3$), and washed well with water. This aluminum plate was immersed in a 25% by mass sodium hydroxide aqueous solution at 45° C. for 9 seconds to be etched, and washed with water. Then, the aluminum plate was further immersed in a 20% by mass nitric acid for 20 seconds at 60° C., and washed with water. The etching amount of the grained surface at this time was approximately 3 g/m$^2$.

Next, an electrochemical surface roughening process was continuously performed using an alternating voltage of 60 Hz. The electrolytic solution at this time was a nitric acid 1% by mass aqueous solution (containing 0.5% by mass of Al ions), and the temperature of the solution was 50° C. A waveform of an AC power supply was a trapezoidal and rectangular waveform of an alternating current in which the time TP taken for a current value to reach a peak from zero was 0.8 msec, and a duty ratio was 1:1. Using an alternating current having such a waveform, an electrochemical surface roughening process was performed using a carbon electrode as a counter electrode. Ferrite was used for an auxiliary anode. Current density was 30 A/dm$^2$ as a peak value of the current, and 5% of the current that flowed from the power supply was shunted to the auxiliary anode. The quantity of electricity in nitric acid electrolysis was 175 C/dm$^2$, i.e., the quantity of electricity when the aluminum plate was the anode. Then, washing with water by a spray was performed.

Subsequently, using an electrolytic solution of a hydrochloric acid 0.5% by mass aqueous solution (containing 0.5% by mass Al ions) at a solution temperature of 50° C., an electrochemical surface roughening process was performed by the same method as that in the nitric acid electrolysis on a condition that the quantity of electricity when aluminum plate was the anode was 50 C/dm$^2$. Then, washing with water by a spray was performed.

Next, using a 15% by mass sulfuric acid (containing 0.5% by mass Al ions) as an electrolytic solution, 2.5 g/m$^2$ of a direct current anodic oxidated coating was provided on this aluminum plate at a current density of 15 A/dm$^2$. Then, the aluminum plate was washed with water, and dried.

Subsequently, in order to ensure hydrophilicity of the non-image area, a silicate treatment was performed on this aluminum plate for 10 seconds at 60° C. using a 2.5% by mass No. 3 sodium silicate aqueous solution. Then, the aluminum plate was washed with water to obtain a belt-like support. The amount of Si to be attached was 10 mg/m$^2$. The center line average roughness (Ra) of this substrate was 0.51 μm as measured using a needle having a diameter of 2 μm.

[Application of Undercoat Layer]

Next, the following coating liquid for an undercoat layer was applied onto the belt-like support 12 so that an amount of the dry coating liquid to be applied might be 20 mg/m$^2$. Then, the applied coating liquid for an undercoat layer was dried for 10 seconds at 80° C. by a hot air dryer to produce a belt-like support 12 having an undercoat layer used for the following experiments.

<Coating Liquid for Undercoat Layer>

| | |
|---|---|
| Compound for an undercoat layer having the following structure (1) | 0.18 g |
| Hydroxyethylimino diacetate | 0.10 g |

| | |
|---|---|
| Methanol | 55.24 g |
| Water | 6.15 g |

Compound for undercoat layer (1)    (Mw 100,000)

[Application and Drying of Image Recording Layer]

A coating liquid for an image recording layer having the following composition was applied onto the undercoat layer formed as mentioned above by the coater 14 for an image recording layer. Then, the applied coating liquid for an image recording layer was dried by the dryer 16 for an image recording layer. The coating liquid for an image recording was applied so that the amount of the image recording layer to be applied might be 1.0 g/m² after drying.

The coating liquid for an image recording layer was obtained by mixing and stirring the following photosensitive solution (1) and a micro gel solution (1) immediately before application.

<Photosensitive Solution (1)>

| | |
|---|---|
| Binder polymer (1) [following structure] | 0.240 g |
| Infrared absorbing dye (1) [following structure] | 0.030 g |
| Radical polymerization initiator (1) [following structure] | 0.162 g |
| Radical polymerizable compound tris(acryloyloxyethyl)isocyanurate (NK Ester A-9300, made by Shin Nakamura Chemical Co., Ltd.) | 0.192 g |
| Low molecular hydrophilic compound tris(2-hydroxyethyl)isocyanurate | 0.062 g |
| Low molecular hydrophilic compound (1) [following structure] | 0.050 g |
| Ammonium group containing polymer [following structure] [reduced specific viscosity of 44 cSt/g/ml] | 0.035 g |
| Fluorine surface active agent (1) [following structure] | 0.008 g |
| 2-butanone | 1.091 g |
| 1-methoxy-2-propanol | 8.609 g |

<Micro Gel Solution (1)>

| | |
|---|---|
| Micro gel (1) | 2.640 g |
| Distilled water | 2.425 g |

The structures of the binder polymer (1), the radical polymerization initiator (1), the infrared absorbing dye (1), the low molecular hydrophilic compound (I), the fluorine surface active agent (1), and the ammonium group containing polymer and a method for synthesizing the micro gel (1) are as shown below:

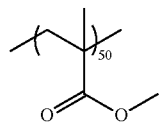 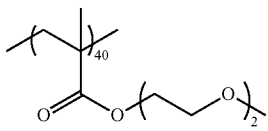

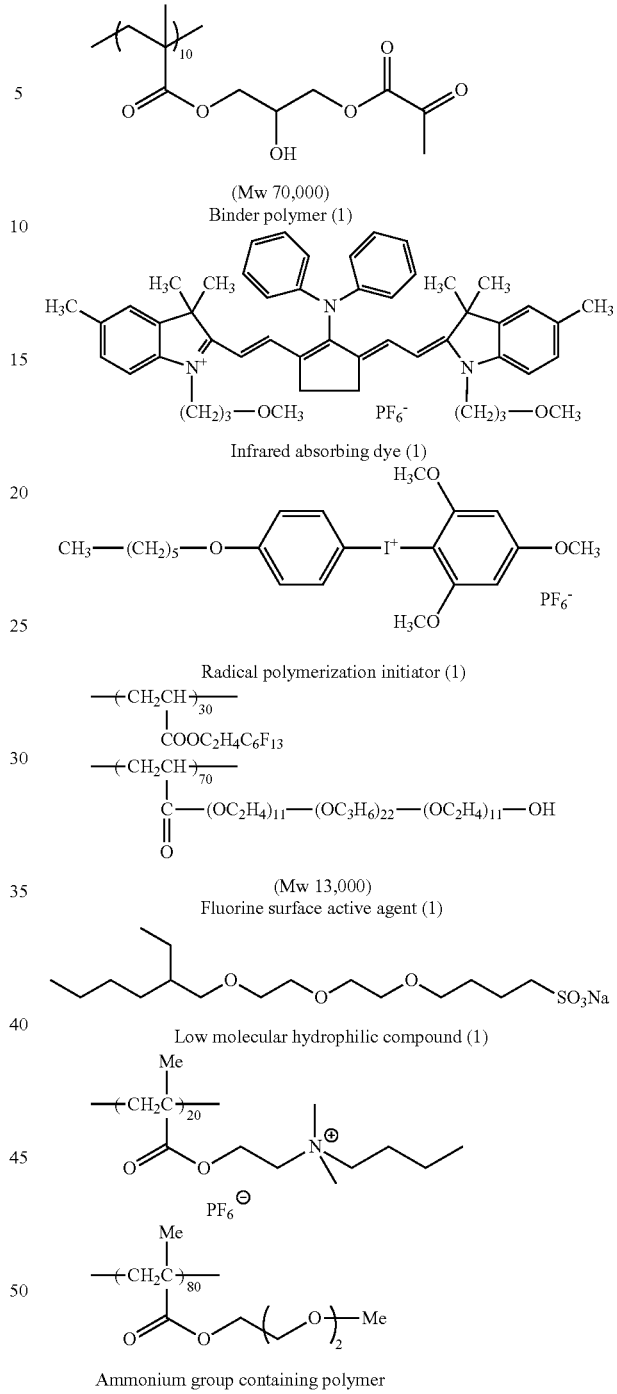

—Synthesis of Micro Gel (1)—

As an oil phase component, 10 g of an adduct of trimethylolpropane and xylenediisocyanate (made by Mitsui Chemicals, Inc., TAKENATE D-110N), 3.15 g of pentaerythritol triacrylate (made by Nippon Kayaku Co., Ltd., SR444), and 0.1 g of Paionin A-41C (made by TAKEMOTO OIL & FAT Co., Ltd.) were dissolved in 17 g of ethyl acetate. As an aqueous phase component, 40 g of a 4% by mass aqueous solution of PVA-205 was prepared. The oil phase component and the aqueous phase component were mixed, and emulsified for 10 minutes at 12,000 rpm using a homogenizer. The obtained emulsified matter was added to 25 g of distilled water and stirred at room temperature for 30 minutes, and subsequently stirred at 50° C. for 3 hours. The solid concentration of the thus-obtained micro gel solution was diluted using distilled water so as to be 15% by mass, and this was used as the micro gel (1). The average particle size of the micro gel was 0.2 μm as measured by a light scattering method.

[Cooling by Support Cooling Device]

The belt-like support 12 having the image recording layer formed was cooled by the first cooling device 28. Then, the belt-like support 12 was further cooled by the second cooling device 30 so that the "film surface temperature after cooling" might be five levels, i.e., 5° C., 10° C., 20° C., 25° C., and 40° C., as shown in Table of FIG. 5.

[Application of Overcoat Layer]

Onto the image recording layer on the belt-like support 12 cooled as mentioned above, a coating liquid for an overcoat layer having the following composition was applied by the coater 18 for an overcoat layer at 10 cc/m² before drying. As shown in the coating liquid for an overcoat layer of FIG. 5 (shown as "OC coating liquid temperature" in the table), the temperature of applied coating liquid was cooled by the coating liquid cooling device 22 so as to be five levels (5° C., 10° C., 15° C., 20° C., and 25° C.).

<Coating Liquid for Overcoat Layer>

| | |
|---|---|
| Inorganic lamellar compound dispersion liquid (1) | 1.5 g |
| Polyvinyl alcohol (CKS50 by the Nippon Synthetic Chemical Industry Co., Ltd., sulfonic acid modified, a saponification degree of not less than 99 mol %, a degree of polymerization of 300) 6% by mass aqueous solution | 0.55 g |
| Polyvinyl alcohol (PVA-405 made by Kuraray Co., Ltd., a saponification degree of 81.5 mol %, a degree of polymerization of 500) 6% by mass aqueous solution | 0.03 g |
| 1% by mass aqueous solution of surface active agent (Emma Rex 710) made by Nihon Emulsion Co., Ltd. | 0.86 g |
| Ion exchange water | 6.0 g |

(Preparation of Inorganic Lamellar Compound Dispersion Liquid (1))

6.4 g of a synthetic mica Somasif ME-100 (made by CO-OP Chemical Co., Ltd.) was added to 193.6 g of ion exchange water, and dispersed using a homogenizer until the average particle size (a laser scattering method) reached 3 μm. The aspect ratio of the obtained dispersed particulates was not less than 100.

[Initial Drying of Overcoat Layer by Initial Drying Device]

The belt-like support 12 having the overcoat layer formed thereon was initially dried by the initial drying device 26 on the initial drying condition of FIG. 5.

[Drying of Overcoat Layer by Dryer for Overcoat Layer]

After the initial drying, the belt-like support 12 was dried for 30 seconds by the dryer 20 for an overcoat layer with hot air at temperature of 120° C. and air amount: 40 m³/min. The amount of the overcoat layer to be applied after drying was 0.15 g/m². Thus, the lithographic printing plates of Examples 1 to 10 and Comparative Examples 1 to 10 were produced.

[Evaluation of Lithographic Printing Plate]

In evaluation of the lithographic printing plates of Examples 1 to 10 and Comparative Examples 1 to 10, the "surface state" and the "mixed content of the overcoat layer" were examined, and thereby "on-press developing properties" and "print durability" important as a function of the lithographic printing plate were evaluated, as shown in Table of FIG. 5. Methods for evaluating the respective items are as follows.

(1) Surface State

Sensory evaluation was visually performed about presence/absence of gloss unevenness in the overcoat layer surface after drying by the dryer for an overcoat layer. Reference character A expresses no wavelike or streaky gloss unevenness, and reference character F expresses a case where wavelike or streaky gloss unevenness was observed. Then, reference character A was regarded as passed.

(2) Mixed Content of Overcoat Layer

Using a Luxel PLATESETTER T-6000III made by Fujifilm Corporation provided with an infrared semiconductor laser, the whole surface of the obtained lithographic printing plate was exposed on conditions of the rotation speed of an external drum of 1000 rpm, a laser output of 70%, and a resolution of 2400 dpi. The obtained exposed precursor was washed with water to remove the overcoat layer on the image recording layer, and thereby the mixed content of the overcoat layer mixed in the image recording layer was determined. Namely, the exposed printing plate was immersed in 25° C. water for 30 seconds, and subsequently the surface of the printing plate precursor was rubbed 10 times using a cellulose sponge. On the basis of the mass of the printing original plate after drying (A) and the mass thereof before washing with water (B), the mixed content (%) of the overcoat layer was calculated by the following formula.

The mixed content (%) of the overcoat layer=(($B$)−($A$))/amount of the overcoat layer applied×100.

Then, the case where the mixed content (%) of the overcoat layer was less than 50% was determined as passed.

In the case where mica is contained in the overcoat layer, the mixed content of the overcoat layer can also be estimated by measuring and comparing magnesium strength (derived from the mica) before and after washing.

(3) On-Press Developing Properties

The obtained lithographic printing plate was wrapped in an aluminum craft with a slip sheet and a protective cardboard whose humidity was controlled to 70% at 25° C., and was kept for four days in an oven at 60° C. The lithographic printing plate obtained by heating for acceleration was exposed on conditions of the rotation speed of the external drum of 1000 rpm, a laser output of 70%, and a resolution of 2400 dpi by using a Luxel PLATESETTER T-6000III made by Fujifilm Corporation provided with an infrared semiconductor laser. A solid image and a 50% halftone dot chart of a 20 μm dot FM screen were included in the exposed image. The obtained exposed precursor was attached to a printing cylinder of a printer LITHRONE26 by Komori Corp. without performing the development treatment on the precursor. Using dampening water Ecolity-2 (made by Fujifilm Corporation)/tap water=2/98 (capacity ratio) and a Values-G(N) black ink (made by DIC Corporation), the dampening water and the ink were supplied and on-press development was performed by the standard automatic printing start method of LITHRONE26, and then, 100 sheets of Tokubishi art (made by Mitsubishi Paper Mills Ltd., 76.5 kg) paper were printed at a printing speed of 10000 sheets per hour. The number of print copies needed until the unexposed portion of the image recording layer on the printer was completely removed and the ink was no longer transferred onto the non-image area was measured as on-press developing properties. Then, not more than 50 sheets were determined as passed.

(4) Print Durability

Using a Luxel PLATESETTER T-6000III made by Fujifilm Corporation provided with an infrared semiconductor laser, the obtained lithographic printing plate was exposed on conditions of the rotation speed of the external drum of 1000 rpm, a laser output of 70%, and a resolution of 2400 dpi. A solid image and a 50% halftone dot chart of a 20 μm dot FM screen were included in the exposed image.

The obtained exposed precursor (printing plate) was attached to a printing cylinder of a printer LITHRONE26 by Komori Corp. without performing the development treatment on the precursor. Using dampening water Ecolity-2 (made by Fujifilm Corporation)/tap water=2/98 (capacity ratio) and a Values-G(N) black ink (made by DIC Corporation), the dampening water and the ink were supplied and on-press development was performed by the standard automatic printing start method of LITHRONE26, and then, 100 sheets of Tokubishi art (76.5 kg) paper were printed at a printing speed of 10,000 sheets per hour. As the number of print copies was increased, the image recording layer was gradually worn out so that an ink concentration on the printed matter was reduced. Print durability was evaluated by a print expiration copy number which was a number of print copies when a value obtained by measuring a proportion of a halftone dot area of an FM screen 50% halftone dot in printed matter using a Gretag densitometer was reduced by 5% compared to the value measured when the 100th sheet was printed. Then, not less than 40,000 sheets were determined as passed.

Examples and Comparative Examples

Examples were the case where the cooling conditions on the coating liquid cooling device 22, the support cooling device 24, and the initial drying device 26 satisfied all of (A) to (C) below. On the other hand, Comparative Examples were the case where the cooling conditions on the coating liquid cooling device 22, the support cooling device 24, and the initial drying device 26 did not satisfy any one of (A) to (C).

(A) By the coating liquid cooling device 22, cooling is performed so that $T_L+10°$ C.$\leq T1 \leq T_L+20°$ C. may be satisfied. $T_L$ is a temperature of a component having a lowest melting point or glass transition temperature among the composition components that form the coating liquid for an image recording layer, and a component having a melting point or glass transition temperature of not more than 0° C. is contained in the present Examples. Then, $T_L$ is 0° C. Accordingly, because $T_L$ is 0° C., the temperature T1 of the coating liquid for an overcoat layer is in the range of 10° C. to 20° C.

(B) By the support cooling device 24, cooling is performed so that $T_L+10°$ C.$\leq T2 \leq T_L+20°$ C. may be satisfied. Because $T_L$ is 0° C. in the present Examples, T2 is in the range of 10° C. to 20° C., which is the same as the range of cooling temperature of the coating liquid for an overcoat layer.

(C) By the initial drying device 26, the overcoat layer is initially dried by blowing cold air parallel to the surface of the overcoat layer at an air velocity of 8 to 15 m/sec, the cold air having a low temperature of not less than the lower limit in the temperature range of the cooled belt-like support 12 and not more than the lower limit+30° C., and a dew point of not more than 5° C. Accordingly, because the temperature of the cooled belt-like support 12 is from 10° C. to 20° C. as described above, the temperature of the cold air is from 10° C. to 40° C. In both of Examples and Comparative Examples, the drying time of the initial drying was 5 seconds.

Example 1

The temperature of the support before the overcoat layer was applied was 10° C., the temperature of the coating liquid for an overcoat layer was 10° C., the temperature of the cold air at the initial drying was a lower limit of 10° C., and the air velocity was a lower limit of 8 m/s (seconds), and the temperature of the dew point was an upper limit of 5° C. All of the above conditions of (A), (B), and (C) were satisfied.

Example 2

The conditions were the same as those in Example 1 except that the air velocity was 10 m/s (seconds).

Example 3

The conditions were the same as those in Example 1 except that the air velocity was an upper limit of 15 m/s (seconds).

Example 4

The conditions were the same as those in Example 1 except that the temperature of the cold air was 25° C.

Example 5

The conditions were the same as those in Example 1 except that the temperature of the cold air was an upper limit of 40° C.

Example 6

The conditions were the same as those in Example 1 except that the temperature of the support was 15° C.

Example 7

The conditions were the same as those in Example 1 except that the temperature of the support was an upper limit of 20° C.

Example 8

The conditions were the same as those in Example 1 except that the temperature of the dew point was 3° C.

Example 9

The conditions were the same as those in Example 1 except that the temperature of the coating liquid was 15° C.

Example 10

The conditions were the same as those in Example 1 except that the temperature of the coating liquid was an upper limit of 20° C.

Comparative Example 1

The conditions were the same as those in Example 1 except that the temperature of the support was 5° C. In this case, the lower limit of the above (B) was not satisfied.

Comparative Example 2

The conditions were the same as those in Example 1 except that the temperature of the support was 25° C. In this case, the upper limit of the above (B) was not satisfied.

Comparative Example 3

The conditions were the same as those in Example 1 except that the temperature of the support was 40° C. In this case, the upper limit of the above (B) was not satisfied.

Comparative Example 4

The conditions were the same as those in Example 1 except that the temperature of the cold air was 5° C. In this case, the lower limit of the temperature of the cold air in the above (C) was not satisfied.

Comparative Example 5

The conditions were the same as those in Example 1 except that the temperature of the cold air was 50° C. In this case, the upper limit of the temperature of the cold air in the above (C) was not satisfied.

Comparative Example 6

The conditions were the same as those in Example 1 except that the air velocity was 5 m/s (seconds). In this case, the lower limit of the air velocity in the above (C) was not satisfied.

Comparative Example 7

The conditions were the same as those in Example 1 except that the air velocity was 18 m/s (seconds). In this case, the upper limit of the air velocity in the above (C) was not satisfied.

Comparative Example 8

The conditions were the same as those in Example 1 except that the temperature of the dew point was 10° C. In this case, the upper limit of the temperature of the dew point in the above (C) was not satisfied.

Comparative Example 9

The conditions were the same as those in Example 1 except that the temperature of the coating liquid was 5° C. In this case, the lower limit of the above (A) was not satisfied.

Comparative Example 10

The conditions were the same as those in Example 1 except that the temperature of the coating liquid was 20° C. In this case, the upper limit of the above (A) was not satisfied.

[Test Results]

In all of Examples 1 to 10, the surface state and the mixed content of the overcoat layer were regarded as passed. As a result, on-press developing properties and print durability which were important as functions of the lithographic printing plate were also regarded as passed.

On the other hand, in Comparative Examples 1 to 10 except Comparative Examples 7 and 10, the mixed content of the overcoat layer was not less than 50%. In Comparative Example 7, the air velocity in the initial drying was 18 m/s (seconds), which was too strong. For this reason, the surface state was regarded as F. In Comparative Example 10, the temperature of the coating liquid for an overcoat layer was 25° C., which was higher than the upper limit of the presently disclosed subject matter. For this reason, the value showing on-press developing properties was 51 sheets, and Comparative Example 10 was regarded as failed by a narrow margin. However, other items were passed.

As seen from the above results, when the cooling conditions of the coating liquid cooling device 22, the support cooling device 24, and the initial drying device 26 satisfy all of (A) to (C) above in production of the lithographic printing plate, mixing of the image recording layer with the overcoat layer could be effectively suppressed. Thereby, on-press developing properties and print durability could be improved.

What is claimed is:

1. A method for producing a lithographic printing plate comprising:

applying a first coating liquid having a composition comprising at least a sensitizing dye, a radical polymerization initiator, and a radical polymerizable compound onto a belt-like support continuously conveyed, and drying the applied first coating liquid to form an image recording layer;

cooling a second coating liquid for an overcoat layer in a manner that the temperature, T1, of the coating liquid for an overcoat layer falls within a temperature range of $T_L+10°\text{C.}\leq T1\leq T_L+20°\text{C.}$, wherein $T_L$ is defined as the melting point or glass transition temperature of a component having the lowest melting point or glass transition temperature among composition components that form the first coating liquid for the image recording layer, with the exception that in the case where said lowest melting point or glass transition temperature is lower than 0° C., $T_L$ is 0° C.;

applying the second coating liquid for the overcoat layer onto the image recording layer;

cooling the belt-like support after forming the image recording layer and before applying the overcoat layer in a manner that the temperature of the belt-like support having the image recording layer formed thereon falls within the temperature range of the second coating liquid for the overcoat layer;

initially drying the overcoat layer by blowing cold air parallel to a surface of the overcoat layer at an air velocity of 8 to 15 m/sec after applying the overcoat layer and before drying the overcoat layer, the cold air having a low temperature of not less than a lower limit in a temperature range of the cooled belt-like support and not more than the lower limit +30° C. and having a dew point of not more than 5° C.;

and drying the overcoat layer after the initial drying.

2. The method for producing a lithographic printing plate according to claim 1, wherein at the initial drying, the overcoat layer is dried until the overcoat layer reaches a set-to-touch state.

3. The method for producing a lithographic printing plate according to claim 1 or 2, wherein the image recording layer is an image recording layer on which an image can be formed by supplying at least one of a printing ink and dampening water on a printer after exposure to remove an unexposed portion.

4. The method for producing a lithographic printing plate according to claim 1, wherein the overcoat layer comprises a water soluble polymer.

5. The method for producing a lithographic printing plate according to claim 4, wherein the water soluble polymer of the overcoat layer is polyvinyl alcohol.

6. The method for producing a lithographic printing plate according to claim 1, wherein the overcoat layer contains a lamellar compound.

7. The method for producing a lithographic printing plate according to claim 6, wherein the lamellar compound of the overcoat layer is mica.

* * * * *